(12) United States Patent
Fields

(10) Patent No.: US 7,598,148 B1
(45) Date of Patent: *Oct. 6, 2009

(54) NON-SELF-ALIGNED HETEROJUNCTION BIPOLAR TRANSISTOR AND A METHOD FOR PREPARING A NON-SELF-ALIGNED HETEROJUNCTION BIPOLAR TRANSISTOR

(76) Inventor: Charles H. Fields, 3871 Cottonwood Grove Trail, Calabasas, CA (US) 91301

( * ) Notice: Subject to any disclaimer, the term of this patent is extended or adjusted under 35 U.S.C. 154(b) by 672 days.

This patent is subject to a terminal disclaimer.

(21) Appl. No.: 10/966,222

(22) Filed: Oct. 15, 2004

(51) Int. Cl.
*H01L 21/331* (2006.01)
(52) U.S. Cl. .................. 438/312; 438/309; 438/320; 257/E21.371; 257/E29.033
(58) Field of Classification Search .............. 438/309, 438/312, 320; 257/E21.371, E29.033
See application file for complete search history.

(56) References Cited

U.S. PATENT DOCUMENTS

| | | | |
|---|---|---|---|
| 5,206,524 A | 4/1993 | Chen et al. ................ 257/29 |
| 5,296,733 A | 3/1994 | Kusano et al. ............ 257/586 |
| 5,298,439 A | 3/1994 | Liu et al. .................. 438/319 |
| 5,371,022 A | 12/1994 | Hsieh et al. .............. 438/311 |
| 5,618,754 A * | 4/1997 | Kasahara ................... 438/653 |
| 5,670,801 A | 9/1997 | Nakano ..................... 257/18 |
| 5,804,487 A | 9/1998 | Lammert .................. 438/319 |
| 5,994,194 A | 11/1999 | Lammert .................. 438/319 |
| 6,271,097 B1 | 8/2001 | Morris ...................... 438/312 |
| 6,458,668 B1 * | 10/2002 | Yoon et al. ................ 438/312 |
| 6,462,362 B1 * | 10/2002 | Miyoshi .................... 257/198 |
| 6,815,304 B2 | 11/2004 | Sankin et al. ............. 438/438 |
| 6,855,613 B1 | 2/2005 | Hamm et al. ............. 438/312 |
| 6,924,201 B2 * | 8/2005 | Tanomura et al. ........ 438/312 |
| 7,001,820 B1 | 2/2006 | Miyajima et al. ......... 438/312 |
| 7,030,462 B2 | 4/2006 | Yagura ...................... 257/565 |
| 2001/0011729 A1 | 8/2001 | Singh et al. ............... 257/77 |
| 2001/0042867 A1 * | 11/2001 | Furuhata ................... 257/197 |
| 2002/0020851 A1 | 2/2002 | Sakuma .................... 257/197 |
| 2002/0155670 A1 | 10/2002 | Malik ........................ 438/112 |
| 2003/0077870 A1 | 4/2003 | Yoon et al. ................ 438/312 |
| 2003/0160302 A1 | 8/2003 | Sankin et al. ............. 257/565 |
| 2003/0203583 A1 | 10/2003 | Malik ........................ 438/112 |

(Continued)

OTHER PUBLICATIONS

U.S. Appl. No. 11/156,078, filed Jun. 16, 2005, Fields.

(Continued)

*Primary Examiner*—Charles D. Garber
*Assistant Examiner*—Angel Roman
(74) *Attorney, Agent, or Firm*—Ladas & Parry

(57) ABSTRACT

The present invention refers to a method for preparing a non-self-aligned heterojunction bipolar transistor comprising: preparing a patterned emitter metal on an emitter epi layer of a HBT epi structure on a substrate; preparing an emitter epitaxy below the emitter metal; applying a resist layer on the top surface covering the emitter metal and emitter epitaxy, and the base layer; applying lithography leaving the emitter epitaxy and the emitter metal covered by the resist vertically with a width $p_D$ and leaving a pattern according to the mask in the resist; removing the remaining resist and the base metal covering the resist defining a base metal, the base metal being spaced from the emitter epitaxy and the emitter metal by a distance $x_D$. The present invention refers to a non-self-aligned heterojunction bipolar transistor as prepared by this method.

13 Claims, 24 Drawing Sheets

U.S. PATENT DOCUMENTS

2004/0041235 A1\* 3/2004 Yanagihara et al. ......... 257/565
2005/0035370 A1 2/2005 Chen ........................ 257/198

OTHER PUBLICATIONS

U.S. Appl. No. 11/156,079, filed Jun. 16, 2005, Fields.
U.S. Appl. No. 10/966,219, filed Oct. 15, 2004, Fields.
Andre, P., et al., "InGaAs/InP DHBT Technology and Design Methodology for Over 40 Gb/s Optical Communication Circuits," *IEEE Journal of Solid-State Circuits*, vol. 36, No. 9, pp. 1321-1327 (Sep. 2001).
Broekaert, T.P.E., et al., "InP-HBT Optoelectronic Integrated Circuits for Photonic Analog-to-Digital Conversion," *IEEE Journal of Solid-State Electronics*, vol. 36, No. 9, pp. 1335-1342 (Sep. 2001).
Hafizi, M., et al., "Submicron Fully Self-Aligned ALInAs/GaInAs HBTs For Low-Power Applications," *Device Research Conference*, pp. 80-81 (Jun. 19-21, 1995).
Jensen, J.F., et al., "AlInAs/GaInAs HBT IC Technology," *IEEE Custom Integrated Circuits Conference*, pp. 18.2.1-18.2.4 (1990).
Jensen, J.F., et al., "High Speed Dual Modulus Dividers Using AlInAs-GaInAs HBT IC Technolgoy," *GaAsIC Symposium*, pp. 41-44 (Oct. 7-10, 1990).
Liu, W., *Handbook of III-V Heterojunction Bipolar Transistors*, John Wiley & Sons, Inc., New York, New York, pp. 206-211 (1998).
Mokhtari, M., et al., "100+ GHz Static Divide-by-2 Circuit in InP-DHBT Technology," *IEEE, Journal of Solid-State Circuits*, vol. 38, No. 9, pp. 1540-1544 (Sep. 2003).
Sokolich, M., et al., "A Low-Power 72.8-GHz Static Frequency Divider in AlInAs/InGaAs HBT Technology," *IEEE Journal of Solid-State Circuits*, vol. 36, No. 9, pp. 1328-1334 (Sep. 2001).

\* cited by examiner

PRIOR ART

PRIOR ART

PRIOR ART

Embodiment II

Positive Photolithography

NON-SELF-ALIGNED HETEROJUNCTION BIPOLAR TRANSISTOR AND A METHOD FOR PREPARING A NON-SELF-ALIGNED HETEROJUNCTION BIPOLAR TRANSISTOR

BACKGROUND OF THE INVENTION

1. Field of the Invention

This invention relates to a non-self-aligned heterojunction bipolar transistor (HBT) and a method for preparing a non-self-aligned heterojunction bipolar transistor (HBT).

2. Description of Related Art

The use of self-aligned contacts in the HBT process is to minimize the base access resistance of the device. The use of this technique is known in that fabrication of early HBTs utilized contact lithography or early broadband wafer stepper systems for device fabrication. These systems are capable of limited layer-to-layer registration and therefore, the only technique available to minimize contact spacing was to employ the technique of self-aligned contacts. Large circuit demonstrating yield of known devices is described in T. P. Broekaert, W. Ng, J. F. Jensens, D, Yap, D. L. Persechini, S. Bourgholtaer, C. H. Fields, Y. K. Brown-Boegeman, B. Shi, and R. H. Walden, "InP-HBT Optoelectronic Integrated Circuits for Photonic Anaolog-to-digital Conversion", IEEE Journal of Solid-State Circuits, Vol. 36, No. 9, September 2001, pp. 1335-1342, which is incorporated herein by reference.

While self-aligned HBT devices do demonstrate lower base resistance, this technique is prone to variations in device Beta due to lateral diffusion of minority carriers in the base and recombination at the base metal (BMET) contact which leads to variations in the base current of these devices. Since variations in base current lead to variations in Beta, the HBTs fabricated using self-aligned contacts demonstrate a large range of measured Beta.

A description of general HBT devices can be found in Jensen, J. F.; Stanchina, W. E.; Metzger, R. A.; Rensch, D. B.; Pierce, M. W.; Kargodorian, T. V.; Allen, Y. K., "AlInAs/GaInAs HBT IC technology", Custom Integrated Circuits Conference, 1990, Proceedings of the IEEE 1990, 13-16 May 1990, Pages: 18.2/1-18.2/4, which is incorporated herein by reference.

Another general description of a HBT device is disclosed by Hafizi, M.; Stanchina, W. E.; Sun, H. C., "Submicron fully self-aligned AlInAs/GaInAs HBTs for low-power applications", Device Research Conference, 1995. Digest. 1995 53rd Annual, 19-21 Jun. 1995, Pages: 80-81, which is incorporated herein by reference.

Jensen, J. F.; Stanchina, W. E.; Metzger, R. A.; Rensch, D. B.; Allen, Y. K.; Pierce, M. W.; Kargodorian, T. V, "High speed dual modulus dividers using AlInAs-GaInAs HBT IC technology", Gallium Arsenide Integrated Circuit (GaAs IC) Symposium, 1990. Technical Digest 1990, 12th Annual, 7-10 Oct. 1990, Pages 41-44 describe a general HBT device as well, which is incorporated herein by reference.

Base-emitter shorts are a leading limitation to HBT IC yield. Shorts due to metal spiting during the self-aligned base metal deposition occurs in about 1 in 600 transistors and limits current HBT IC yield to below 2000 transistors. The use of non-self-aligned emitter-base contacts eliminates the possibility of shorting of this type.

In HBTs designed for high-speed applications, current gain is not determined solely by recombination in the bulk of the base epitaxy layer. Both surface and bulk components of base current combine to decrease the overall device current gain. InP HBTs known in the state of the art employ self-aligned base-emitter structures to reduce the extrinsic base resistance and the base-collector junction capacitance. This alignment technique results in narrow contact spacing and potentially large values of surface recombination. Handbook of III-V Heterojunction Bipolar Transistors, W. Liu, 1998 Wiley & Sons, FIGS. 3-54 & 3-55 shows that Beta is extremely sensitive to the spacing of the emitter and base contacts for values closer than about 1500 Å. In this range, minor variations in wet etch isotropy or in metal deposition source angle could lead to wildly varying values of Beta. In a self-aligned HBT, the emitter-base spacing can even approach zero.

The mechanism for reduction and variation in Beta is shown in FIG. 1. FIG. 1 shows that electrons, which are emitted by the emitter epi layer 2, migrate through the base layer 1 to the collector layer 5. A minority of electrons however laterally diffuses and does not reach the collector layer 5 and instead migrates to the base metal 4. Any electron that reaches the base metal 4 instead of collector layer 5 causes reduction and variation in device Beta.

FIG. 11 is a pictorial of a state-of-the-art SA transistor that is currently being fabricated according to the prior art. The BMET layer 4 is a large square which completely overlays the emitter metal (EMET) 3 pattern. The process of manufacturing the SA transistor is shown in FIG. 6 to FIG. 11. First, a patterned emitter metal layer 2 is formed to yield an emitter metal 3 as shown in FIG. 6. This process can be carried out in two different ways. According to one method (1) a photoresist 4 is applied on the emitter layer and (2) exposed through a mask and (3) the exposed photoresist 4 is removed leaving a space pattern in the photoresist 4 for the emitter metal 3 and (4) emitter metal 3 is deposited on the top surface of the wafer and (5) the photoresist 4 and the emitter metal covering the photoresist 4 is removed leaving the emitter metal 3 and the base layer 1. According to a second method (1) an emitter metal layer 3 is deposited on the emitter epi layer 2 (2) photoresist is applied on the emitter metal layer 3 and (3) exposed through a mask and (4) the exposed photoresist 4 is removed leaving a photoresist 4 on the emitter metal layer 3 for the emitter metal 3 and (4) emitter metal 3 which is not covered by the photoresist 4 is removed and (5) the photoresist 4 covering the emitter metal 3 is removed leaving the emitter metal 3 and the base layer 1.

In a further process step the emitter epi layer 2 is etched off to yield an emitter epitaxy 2 below and in line with emitter metal 3. FIG. 7 shows an emitter epitaxy 2 below and in line with the emitter metal 3, wherein the emitter epitaxy has an undercut A. The undercut A is obtained by two etch process steps, a wet etch and a dry etch. The undercut A is necessary for devices according to the prior art between the base metal 4 and the emitter epitaxy 2 as shown in FIGS. 10 and 11. The emitter epitaxy 2 and the emitter metal 3 form a pedestal. In a next step a photoresist layer 8 is applied on the base layer 1 covering the base layer 1 and emitter epitaxy 2 and emitter metal 3 as shown in FIG. 8.

The following process is carried out according to image reversal photolithography as follows. The photoresist layer 8 is irradiated by light 10 through a mask 9. The mask 9 covers the area of the emitter metal 3 in excess, which is not irradiated. After the irradiation the surface of the photoresist layer 8, which was irradiated through the mask 9 becomes insensitive for removing. The area of the photoresist 8, which was covered and therefore not irradiated is sensitive and can be removed as shown in FIG. 8. After removing the sensitive area of the photoresist 8 part of the base layer 1, the emitter epitaxy 2 and the emitter metal 3 are laid free and are not covered by the photoresist layer 8 as shown in FIG. 9. In the next step base metal 4 is applied on the entire top surface as shown in FIG. 10. In the next step the photoresist 8 is removed together with the base metal 4 on top of the photoresist 8 as shown in FIG. 11. The pedestal comprising emitter epitaxy 2 below and in line with emitter metal 3 is covered by the base metal 4. The base metal 4 has a certain distance to the emitter epitaxy 2 in order to avoid a shorting between the base metal 4 and the emitter epitaxy 2. Since the emitter epitaxy 2 has the undercut Δ a shorting between the base metal 4 and the emitter epitaxy 2 is avoided. However, due to the undercut Δ of the emitter epitaxy 2, the contact area between the emitter epitaxy 2 and the emitter metal 3 is reduced.

It is desirable to prepare a device which reduces shorting between the base metal 4 and the emitter epitaxy 2. There is a need for a device that solves the recurring problem of low and varying values of current gain (Beta) in current state-of-the-art HBT devices. There is further a need to solve the problem of variations in HBT Beta from wafer to wafer, variations in HBT Beta within a single wafer and from wafer to wafer. Base emitter shorts, which occur in about 1/600 transistors, lead poor line yield of HBT wafers that needs to be improved.

BRIEF SUMMARY OF THE INVENTION

One aspect of the invention is a device that solves the recurring problem of low and varying values of current gain (Beta) in current state-of-the-art HBT devices.

Another aspect of the invention is a method for preparing a Heterojunction Bipolar Transistor (HBT). The method for preparing a non-self-aligned heterojunction bipolar transistor comprises:
  a) preparing a patterned emitter metal on an emitter layer of a HBT structure on a substrate;
  b) preparing an emitter epitaxy below the emitter metal;
  c) applying a resist layer on the surface covering the emitter metal and emitter epitaxy, and the base layer;
  d) applying lithography covering the peripheral edge of the emitter epitaxy and the emitter metal with a width $p_D$ and leaving a pattern according to the mask in the resist;
  e) depositing base metal on the entire surface; and
  f) removing the remaining resist and the base metal covering the resist defining a base metal, the base metal being spaced from the emitter epitaxy and the emitter metal by a distance $x_D$.

Yet another aspect of the invention is a method for preparing a non-self-aligned heterojunction bipolar transistor, which comprises:
  a) preparing a patterned emitter metal on an emitter layer of a HBT structure on a substrate;
  b) preparing an emitter epitaxy below the emitter metal;
  c) depositing a base metal layer on the top surface;
  d) applying a resist layer on the base metal layer;
  e) applying lithography covering the peripheral edge of the emitter epitaxy and the emitter metal with a width $p_D$ and leaving a pattern according to the mask in the resist;
  f) removing base metal not covered by resist; and
  g) removing the remaining resist and the base metal covering the resist defining a base metal, the base metal being spaced from the emitter epitaxy and the emitter metal by a distance $x_D$.

The solution is in the form of a change to the HBT device layout. The new device layout relies upon optical lithography to pattern the base metal contact layer (BMET) and thereby define the critical emitter-to-base spacing. The device current gain is a very sensitive function of this emitter-base contact spacing. The use of photolithography to control the critical spacing instead of wet etching leads to improved device performance and circuit yield.

The present invention solves the problem of current gain loss and the lateral diffusion of minority carriers in the base that recombine at the BMET interface. At the same time the RF performance is maintained or even improved. Further, the device of the invention has a higher gain and a higher speed. The yield of the device of the invention is higher and the device is more reproducible.

BRIEF DESCRIPTION OF THE SEVERAL VIEWS OF THE DRAWING

FIG. 22 shows a cross-sectional view of a device, which is shown in FIG. 16. FIGS. 12-16 depict the process according to the first embodiment of the present invention and FIGS. 17-22 depict the process according the second embodiment of the present invention. FIG. 16 and FIG. 22 show the cross section of a non-self-aligned heterojunction bipolar transistor as shown in FIG. 23 and in FIG. 24.

Figure 1:
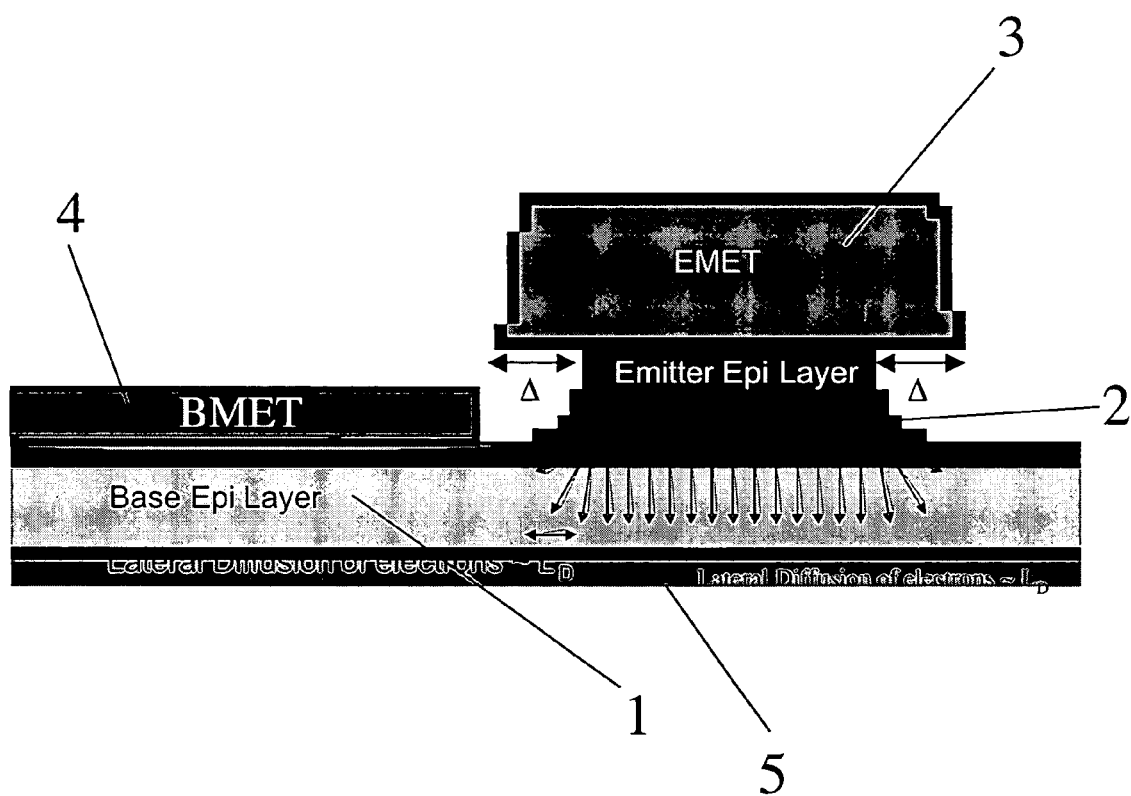
FIG. 1 is a cross sectional view depicting pictorially the recombination mechanism that leads to reductions and variation in device Beta.

REFERENCE NUMERALS 1 base
2 emitter layer
3 emitter metal
4 base metal
5 collector
6 subcollector
7 substrate
8 photoresist
9 mask
10 light

DETAILED DESCRIPTION OF THE INVENTION

The base metal 4 is placed according to the invention at least some multiple of a diffusion length ($L_D$) away from the emitter 2 in order to avoid reduction and variation in device Beta. This is accomplished in self-aligned (SA) HBTs by a method of wet etching of the emitter pedestal (emitter metal 3 and emitter epitaxy 2) to move the emitter epi layer further under the EMET pattern 4. The present invention provides a method of lithography to control this emitter-to-base spacing and to minimize the diffusion of electrons.

Figure 2:
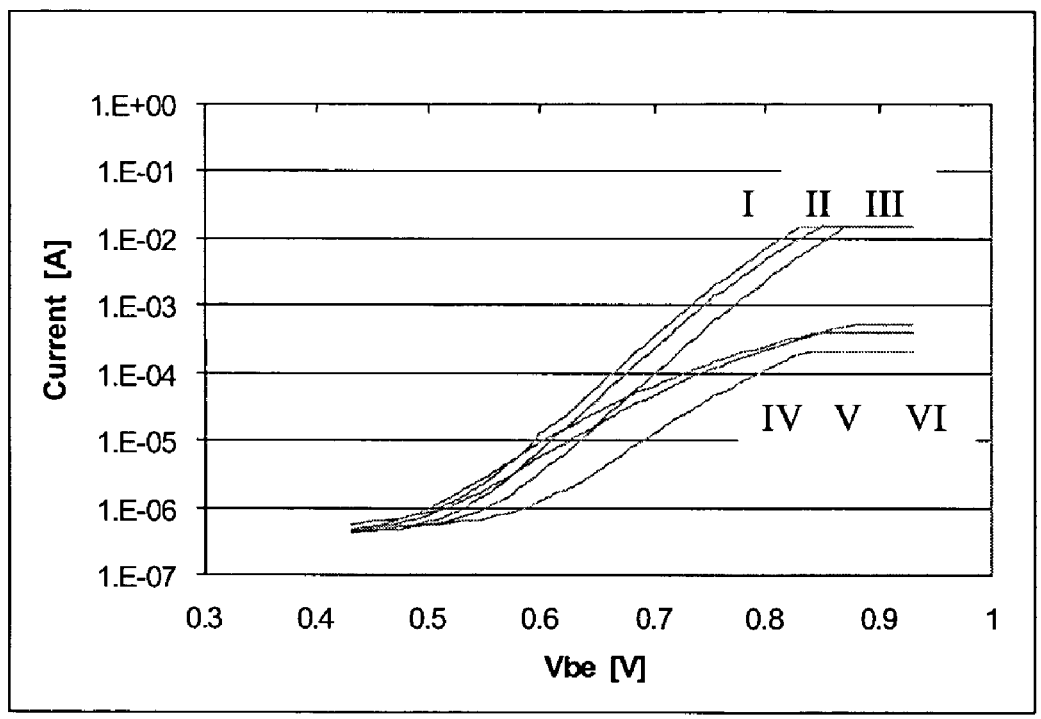
FIG. 2 depicts the measured 2-terminal forward Gummel data for three self-aligned devices (SA InP HBTs) measured on the same wafer (current [A] versus Vbe [V]).

Two-terminal forward Gummel characteristics for three self-aligned HBT devices were measured at three different sites across a three-inch InP wafer as shown in FIG. 2. The top three curves (I, II, III) plot the collector current and show the variation in device turn-on voltage across the wafer. The bottom three curves (IV, V, VI) are the measured base current of the devices, which shows the large variation in leakage current across the wafer for these self-aligned devices.

Figure 3:
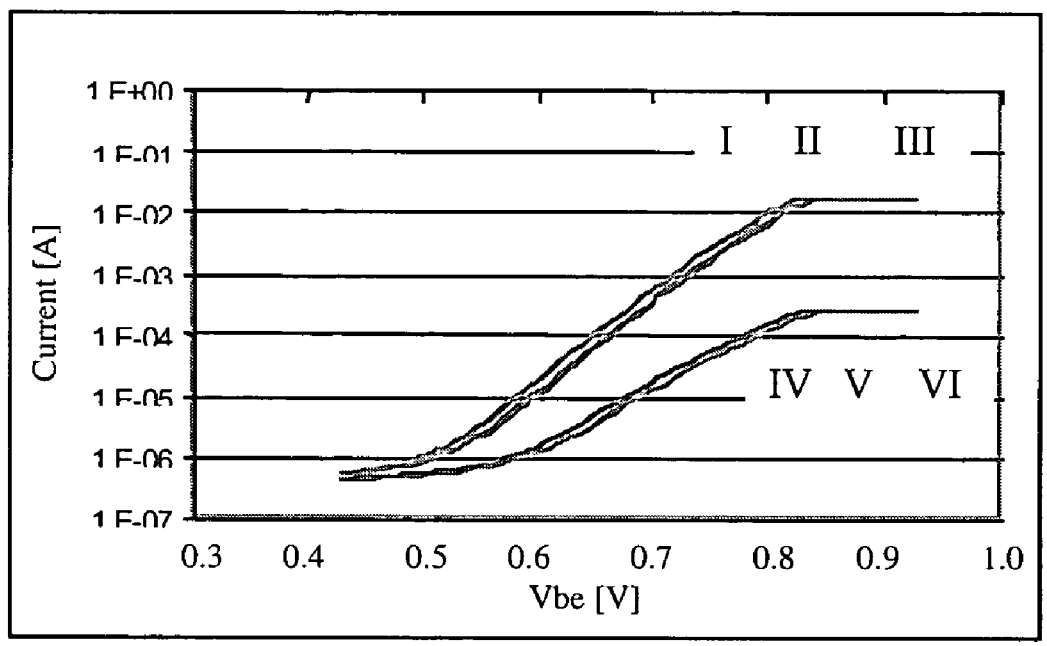
FIG. 3 depicts the measured 2-terminal forward Gummel data for three non-self-aligned devices (NSA InP HBTs) on the same wafer and fields (current [A] versus Vbe [V]).

Two-terminal forward Gummel characteristics for three non-self-aligned (NSA) HBT devices were measured at three different sites across a three-inch InP wafer as shown in FIG. 3. The device measurements plotted here were taken from devices adjacent to the three from FIG. 2. The top three curves (I, II, III) plot the collector current and show that these devices demonstrate a great improvement in minimizing the variation in device turn-on voltage across the wafer. The bottom three curves (IV, V, VI) are the measured base current of the devices which shows significantly lower leakage current as well as reduced variation across the wafer for these non-self-aligned devices. The reduced leakage current demonstrated by these NSA devices leads to higher gain and usable gain at extremely low power levels.

Figure 4:
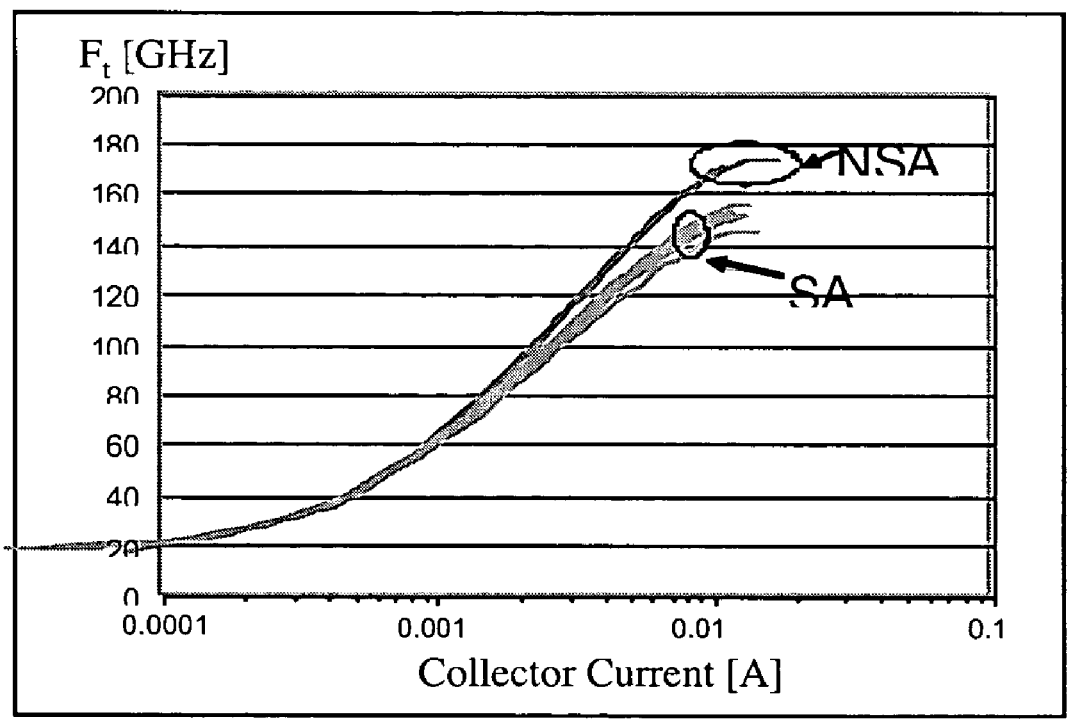
FIG. 4 depicts measurements of the frequency performance of six self-aligned and non-self aligned InP HBTs devices from the same wafer and fields ($F_t$ [GHz] versus $I_c$ [A]) for several devices as shown in FIG. 2 and FIG. 3.

The unity gain cutoff frequency ($F_t$) for the six devices from FIG. 2 and FIG. 3 were measured and are shown in FIG. 4. Extrapolation of ft was done from a single frequency point s-parameter measurement assuming an h21 versus frequency slope of −20 dB/decade. This plot shows that the NSA devices operated at higher frequencies, compared to the self-aligned devices, across the entire range of current or power levels.

Figure 5:
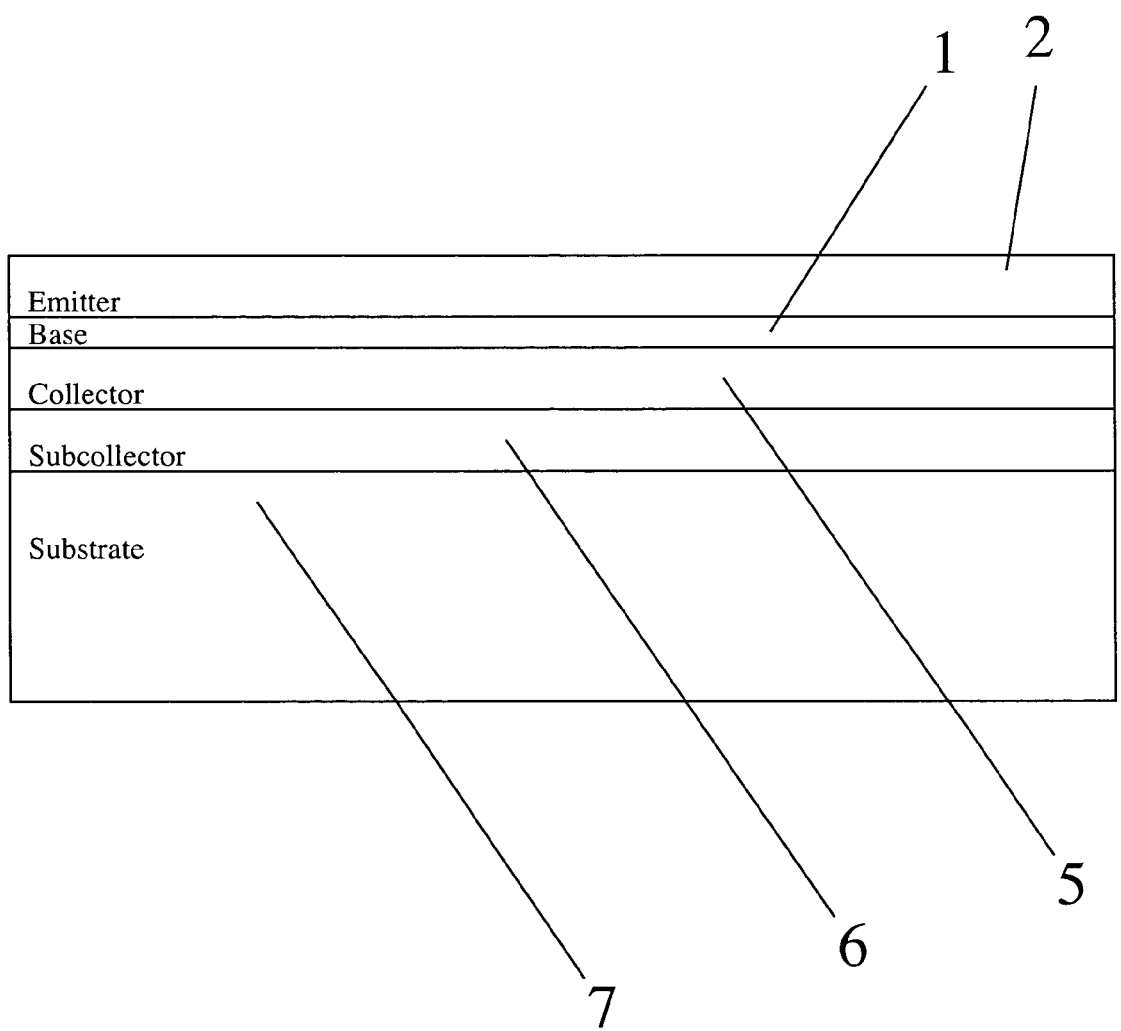
FIG. 5 depicts a cross-sectional view of the starting epitaxial layer structure for an HBT.
Figure 6:
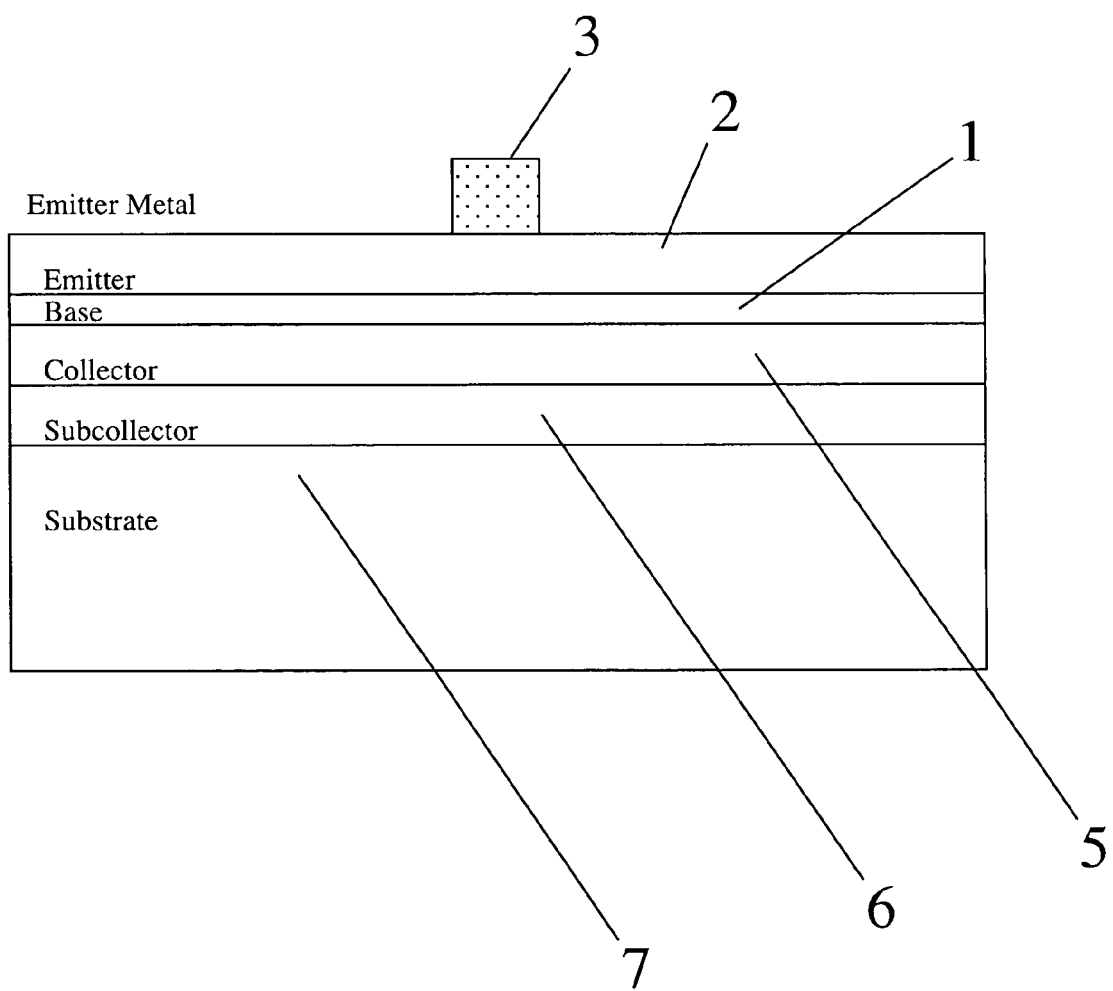
FIG. 6 depicts a cross-sectional view of the layer structure after depositing and patterning emitter metal.
Figure 7:
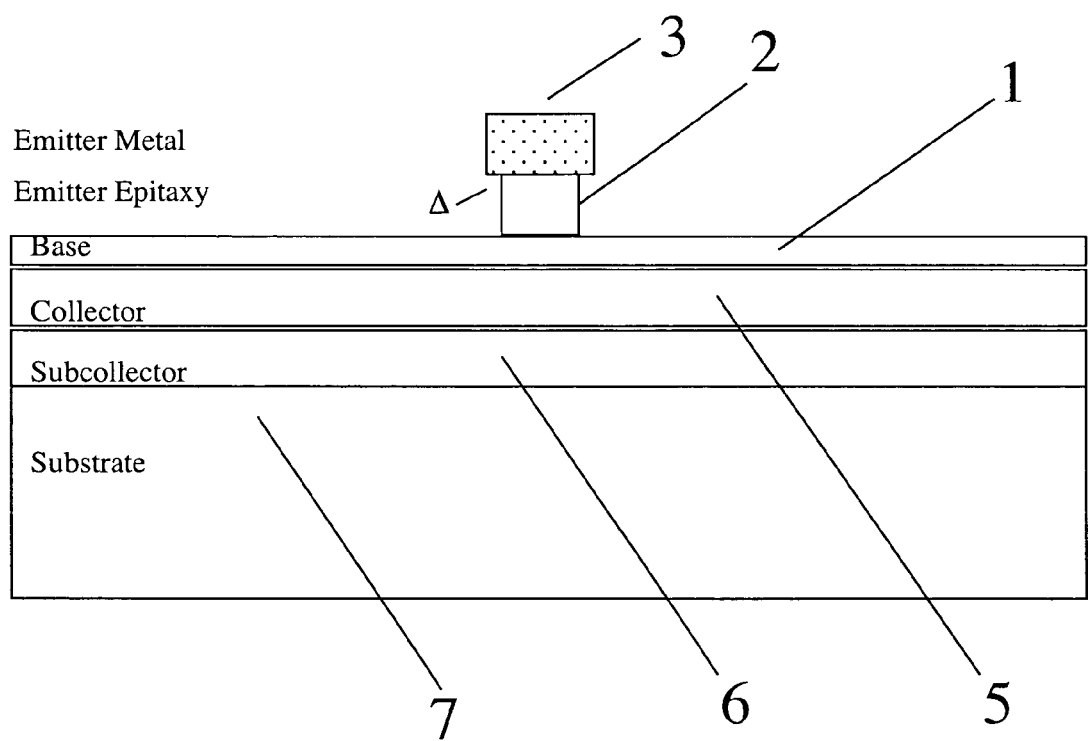
FIG. 7 depicts a cross-sectional view of the layer structure after removing emitter epitaxy layer under the emitter metal showing an undercut A of the emitter epitaxy.

The sole difference between SA and NSA transistors is a simple change to a single layer in the device fabrication process. The starting material is preferably a layer structure, which comprises a base 1. An emitter epi layer 2 is deposited or grown on the base 1 as shown in FIG. 5. Underneath the base layer 1 a collector layer 5 and below the collector layer 5 a subcollector layer 6 is deposited on the substrate 7. An emitter metal layer (EMET) is deposited on the emitter epi layer 2 to yield an emitter metal 3 as shown in FIG. 7. The described layer structure beginning with substrate 7, and on the substrate preferably the following layers are deposited: subcollector 6, collector 5, base layer 1, emitter epi layer 2 and emitter metal layer 3 is a preferred starting material for manufacturing SA and NSA transistors. This structure is called the HBT epi layer structure.

Preparing of Self Aligned HBT by the Additive Method

Figure 16:
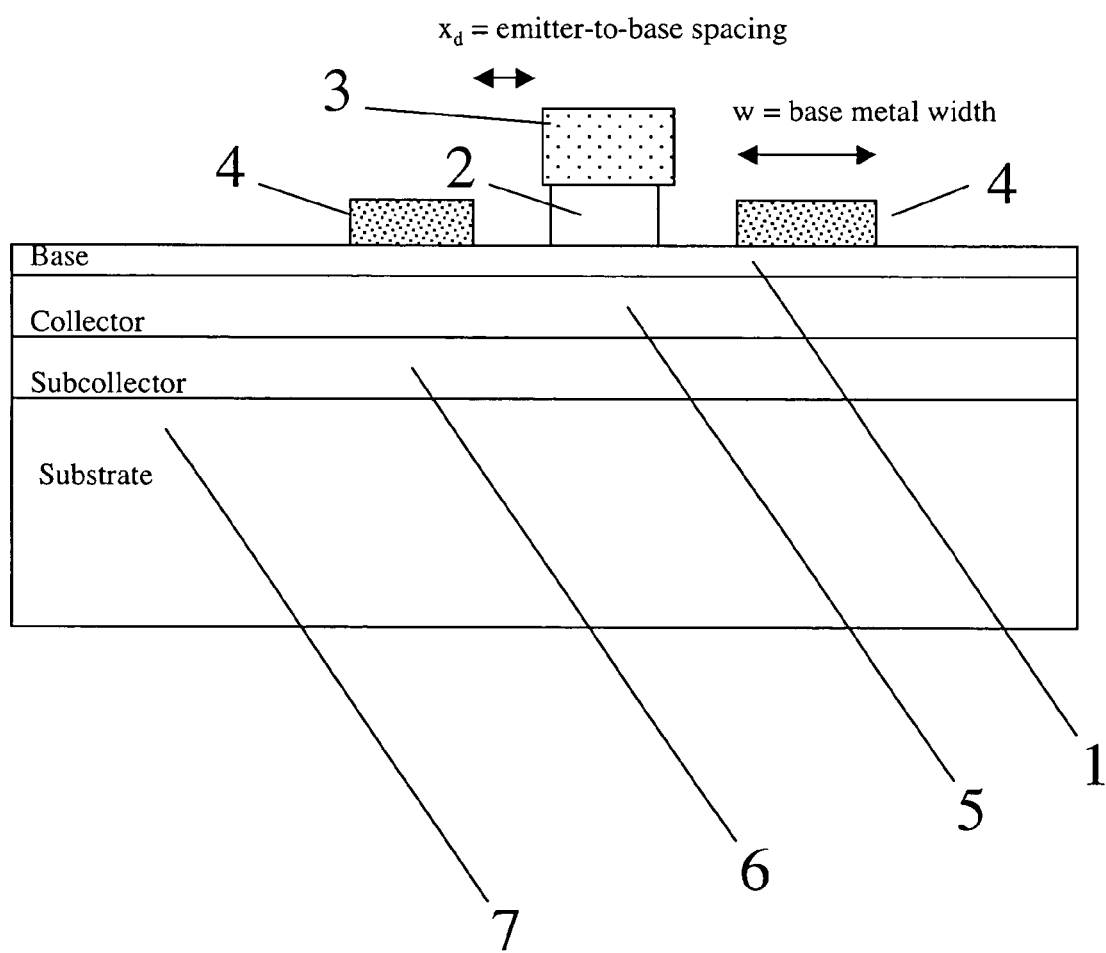
FIG. 16 depicts a cross-sectional view at line 23-23 of the non-self-aligned heterojunction bipolar transistor of FIG. 23 after removing photoresist layer and base metal layer on top of the photoresist layer.
Figure 22:
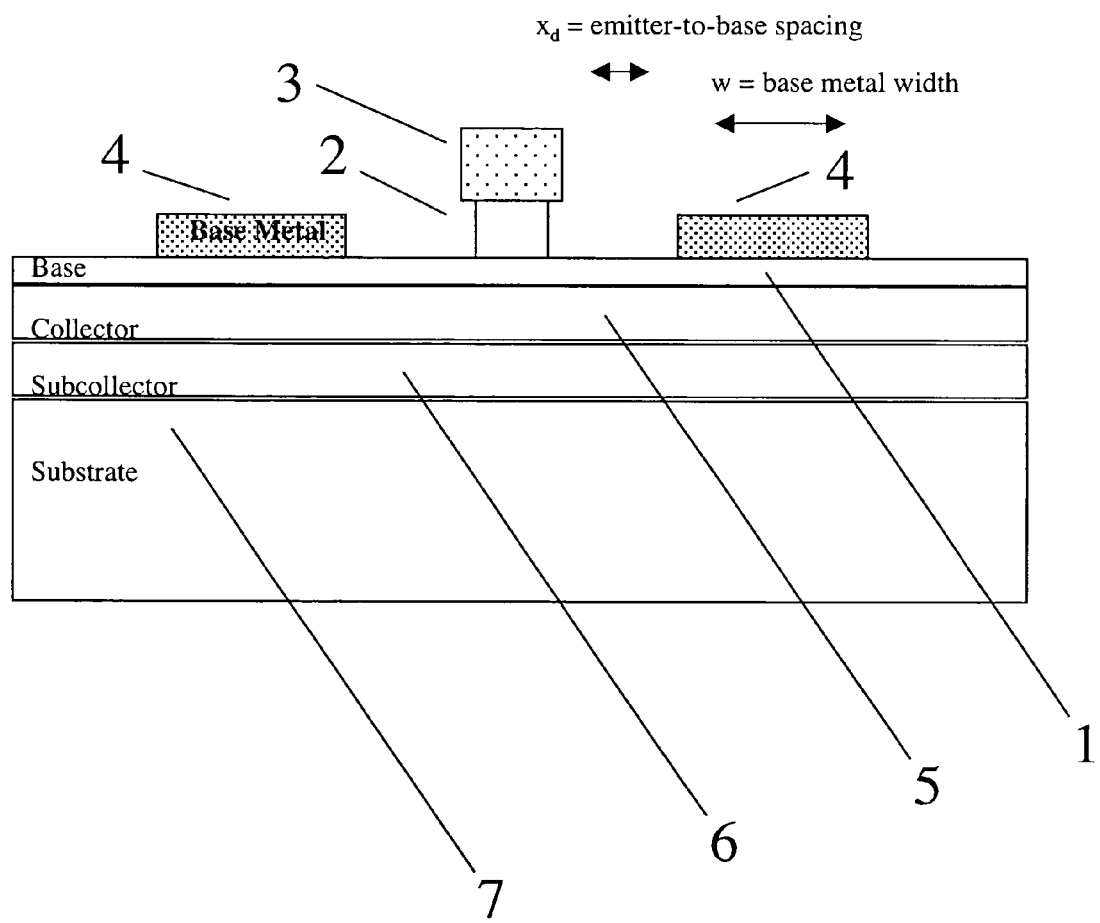
FIG. 22 depicts a cross-sectional view at line 23-23 of the non-self-aligned heterojunction Bipolar Transistor of FIG. 23 after removing the remaining photoresist layer.
Figure 23:
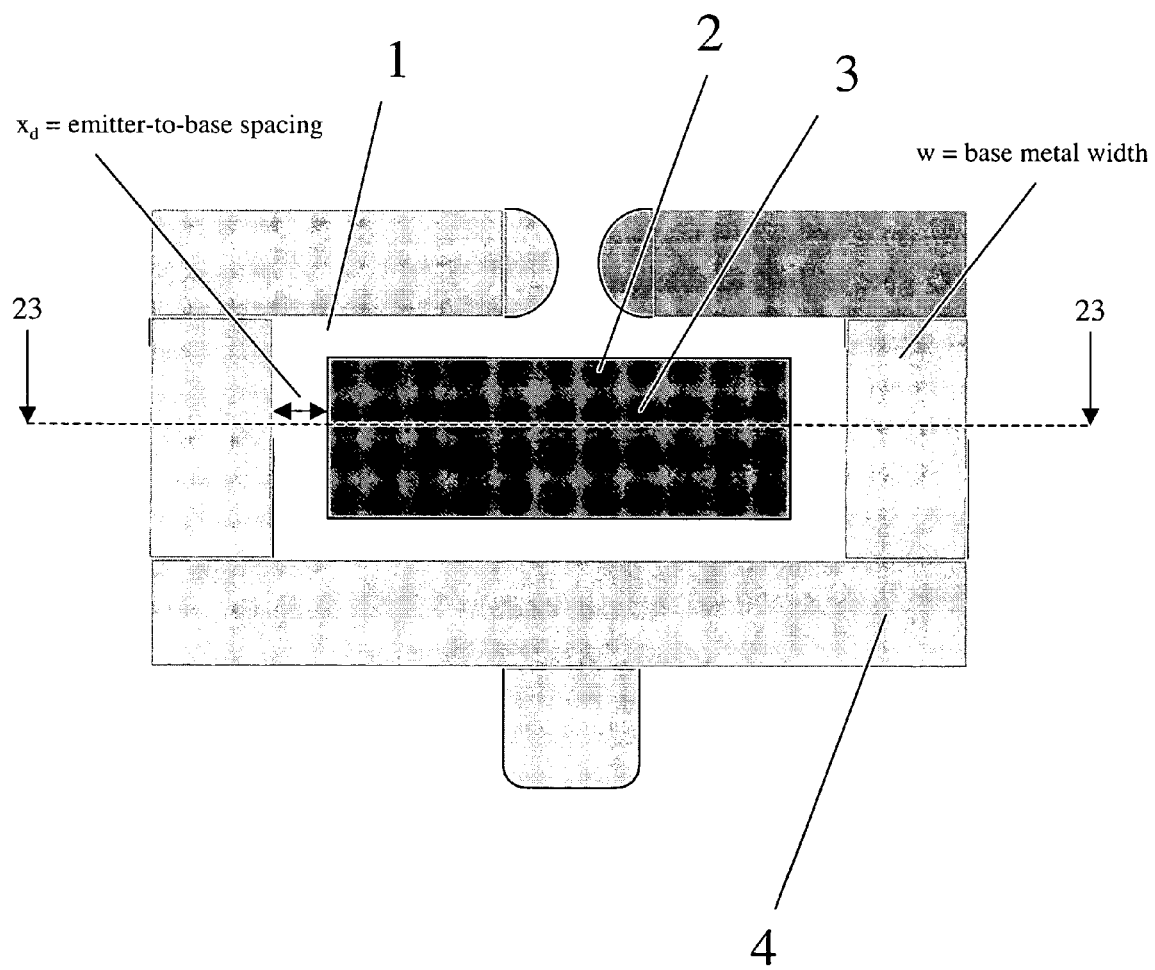
FIG. 23 depicts a top view of the emitter and base mask layers of a generic non-self-aligned heterojunction bipolar transistor.
Figure 24:
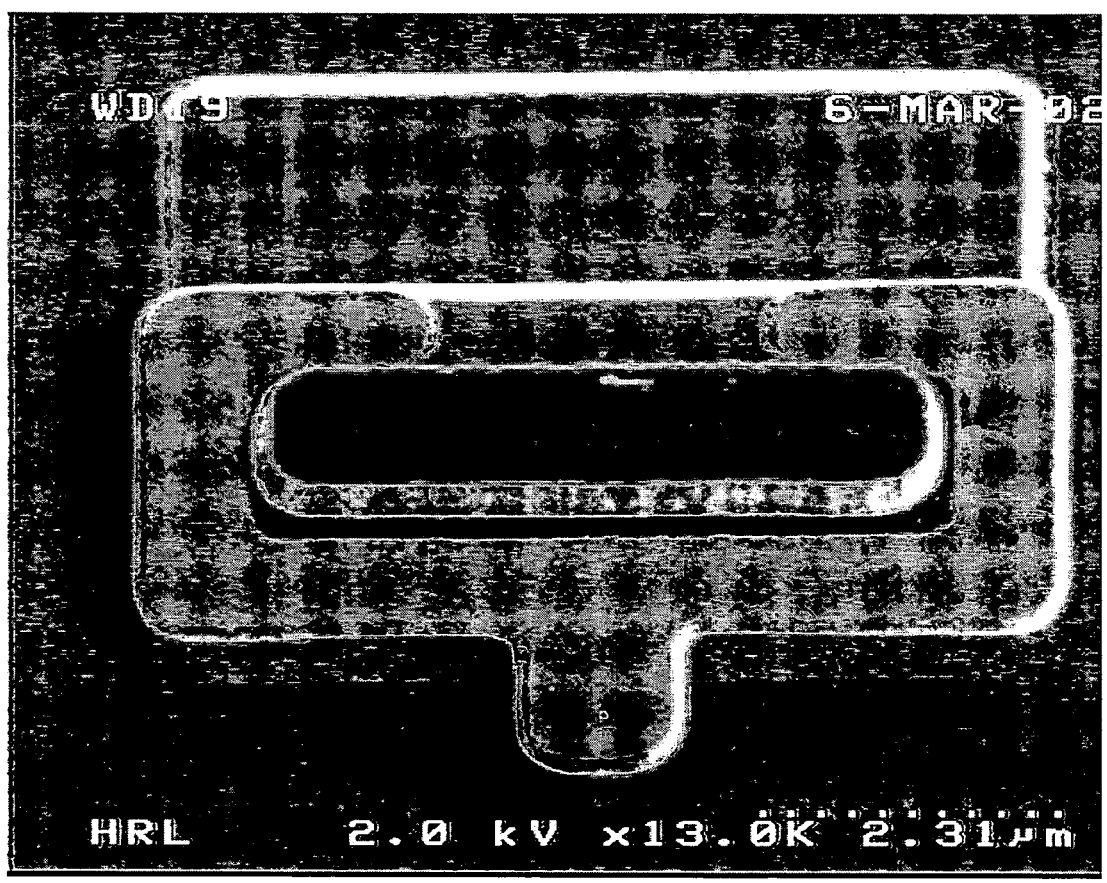
FIG. 24 depicts a Scanning electron micrograph of the NSA HBT depicted in FIG. 23 above.

The starting layer structure as shown in FIG. 7 is used for the method according to this preferred embodiment. FIG. 7 does not show an undercut Δ of the emitter epitaxy 2. The process for yielding emitter epitaxy 2 involves only dry etch. The step of wet etch is omitted. The wet etch process leads to the undercut Δ of the emitter epitaxy 2 which is necessary according to the prior art to avoid shorting between the base metal 4 and the emitter epitaxy 2. The process of the present invention makes it possible to deposit the base metal 4 on the base 1 wherein a controlled distance between the base metal 4 and the emitter epitaxy 2 is reached to avoid shorting as shown in FIGS. 16 and 22.

Figure 8:
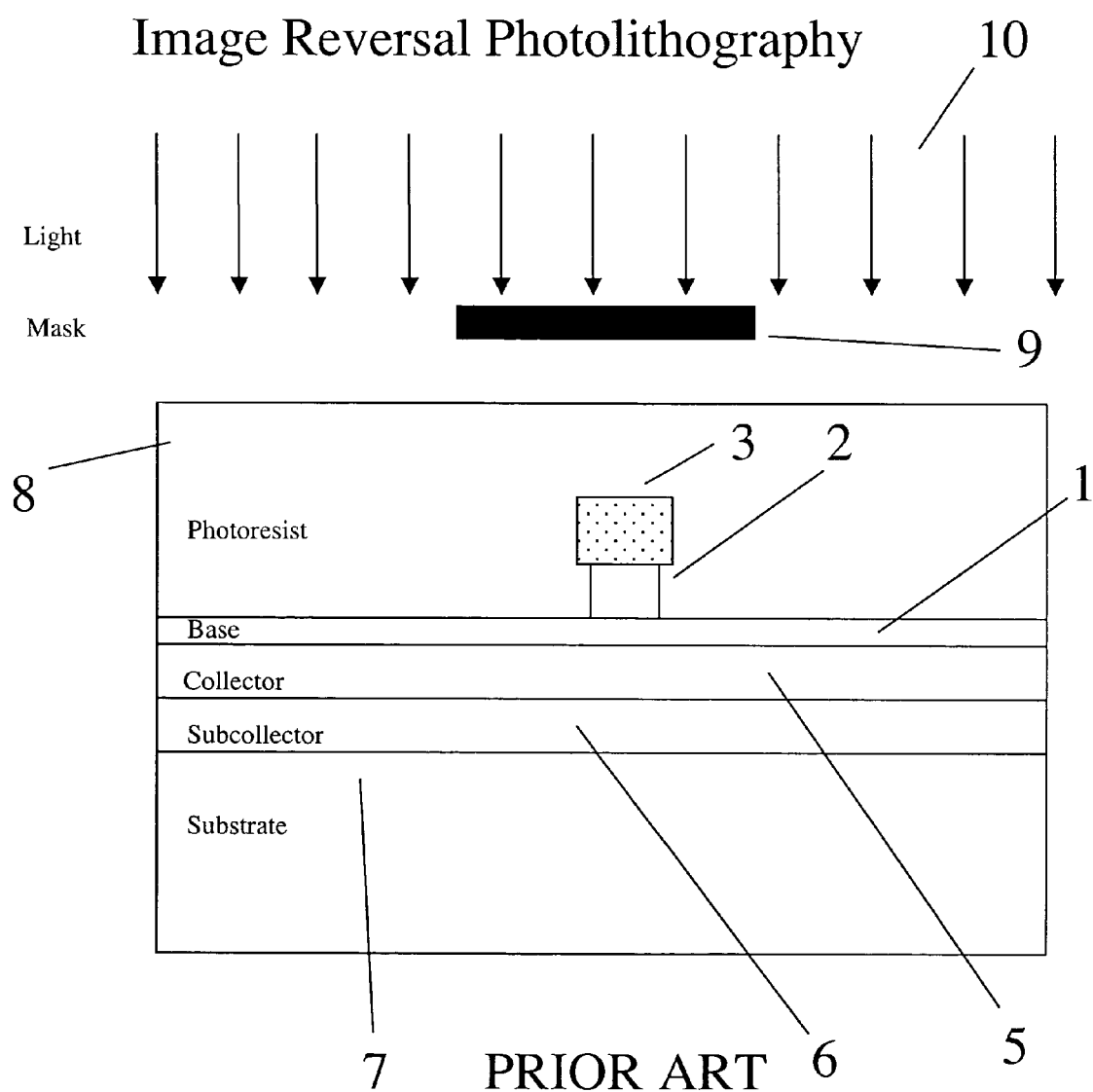
FIG. 8 depicts a cross-sectional view of the layer structure after applying a photoresist layer on the layer structure as shown in FIG. 7 and irradiating the photoresist layer through a mask designed for the process of image reversal photolithography according to the prior art.
Figure 9:
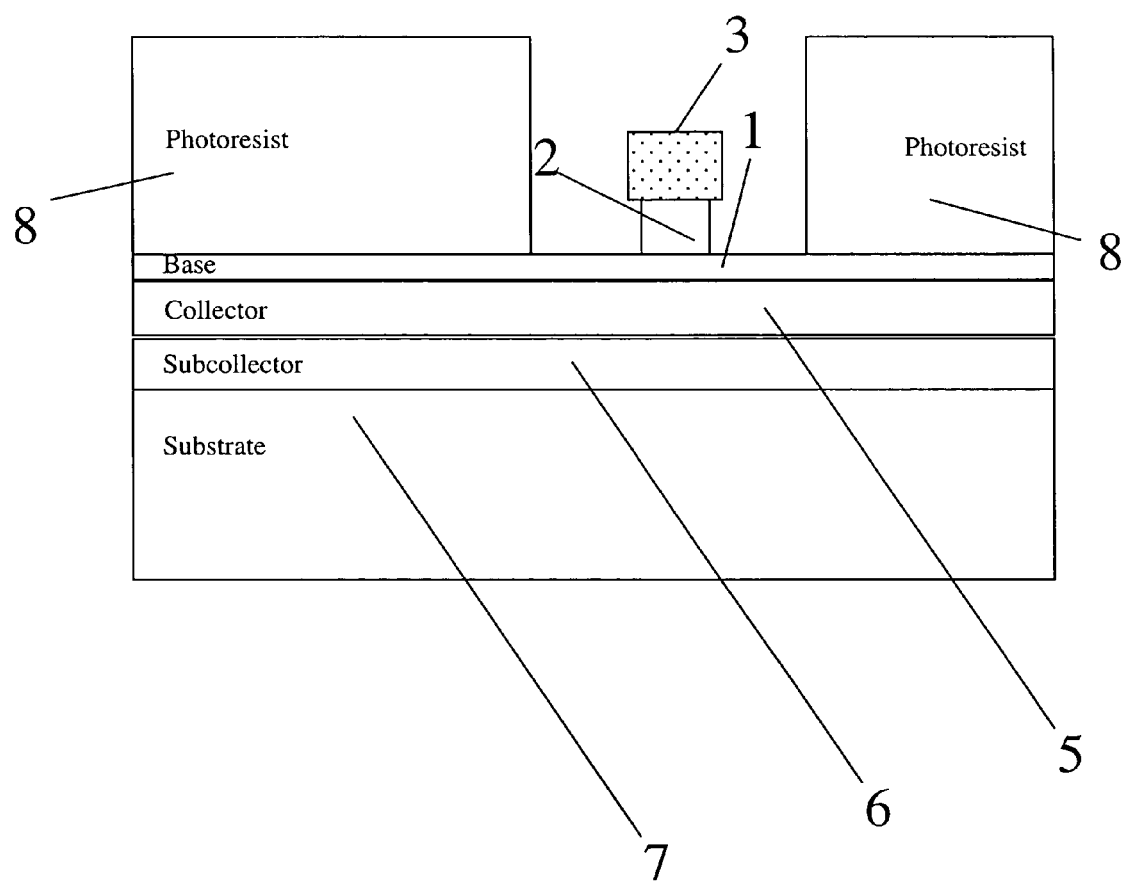
FIG. 9 depicts a cross-sectional view of the layer structure after removing photoresist layer in the desired areas according to the prior art.
Figure 10:
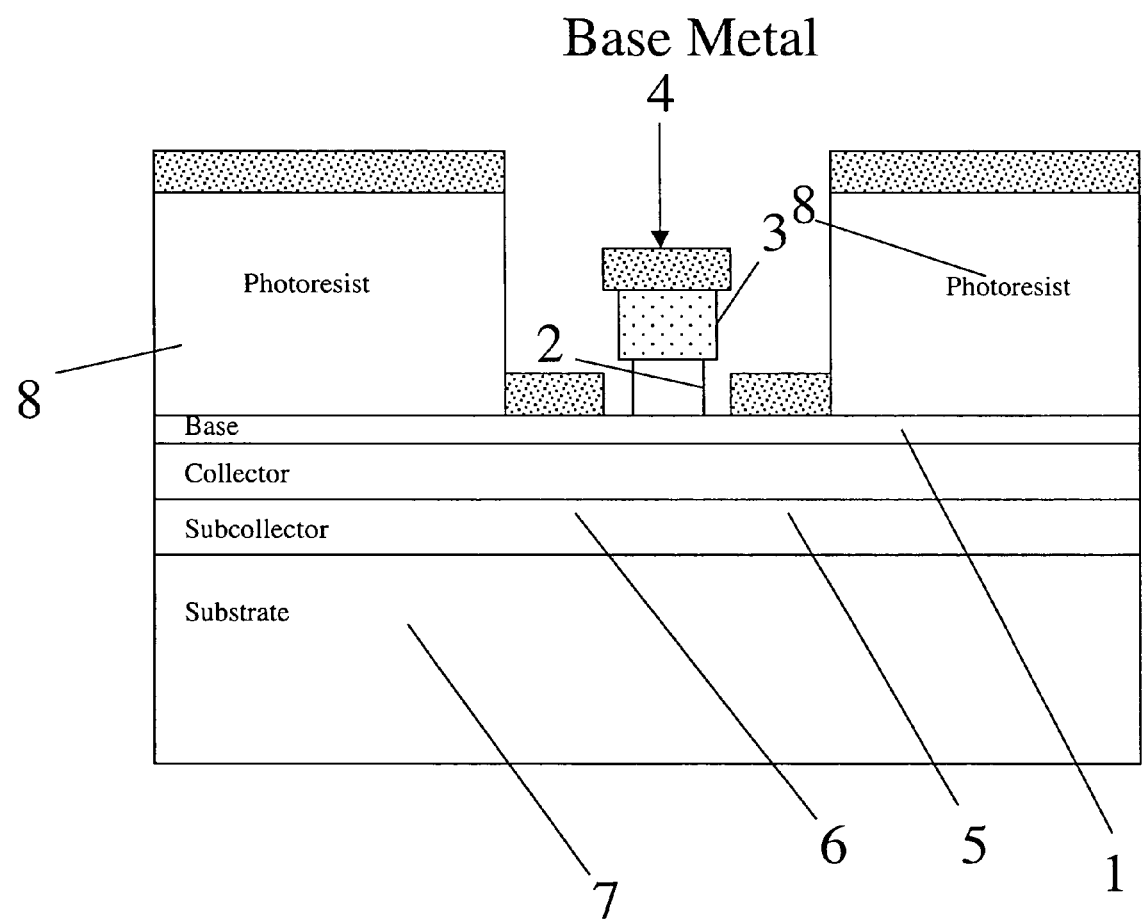
FIG. 10 depicts a cross-sectional view of the layer structure after base metal deposition on the wafer according to the prior art.
Figure 12:
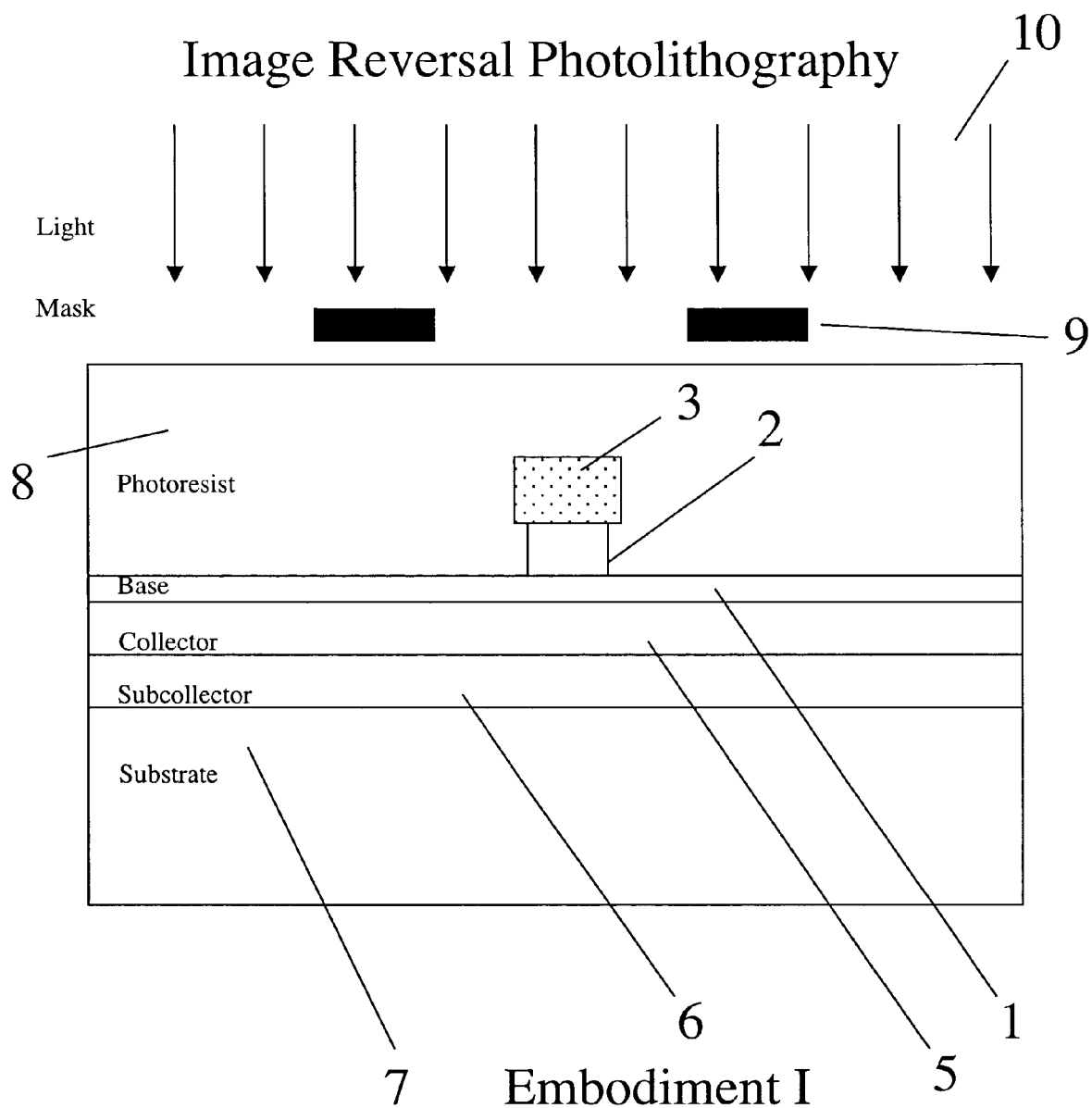
FIG. 12 depicts a cross-sectional view of the layer structure after applying photoresist layer and irradiating the photoresist layer through a mask on the layer structure as shown in FIG. 7, designed for the process of image reversal photolithography according to the first embodiment of the present invention.

A photoresist layer 8 is applied on the top surface layer. Two different methods can be preferably applied to irradiate and remove photoresist layer 8, image reversal photography and positive photolithography. Image reversal photography is shown in FIG. 12 and already explained in the above in regard to FIG. 8. The photoresist layer 8 is irradiated by light 10 through a mask 9. The mask 9 leaves the area of photoresist 8 covering the emitter epitaxy 2 and the emitter metal 3 plus the later emitter-to base spacing $x_D$ on the left and right sight open to be irradiated. After the irradiation the surface of the photoresist layer 8, which was irradiated through the mask 9 becomes insensitive for removing. The area of the photoresist 8, which was covered and therefore not irradiated is sensitive and can be removed as shown in FIG. 12 and FIG. 14.

Figure 13:
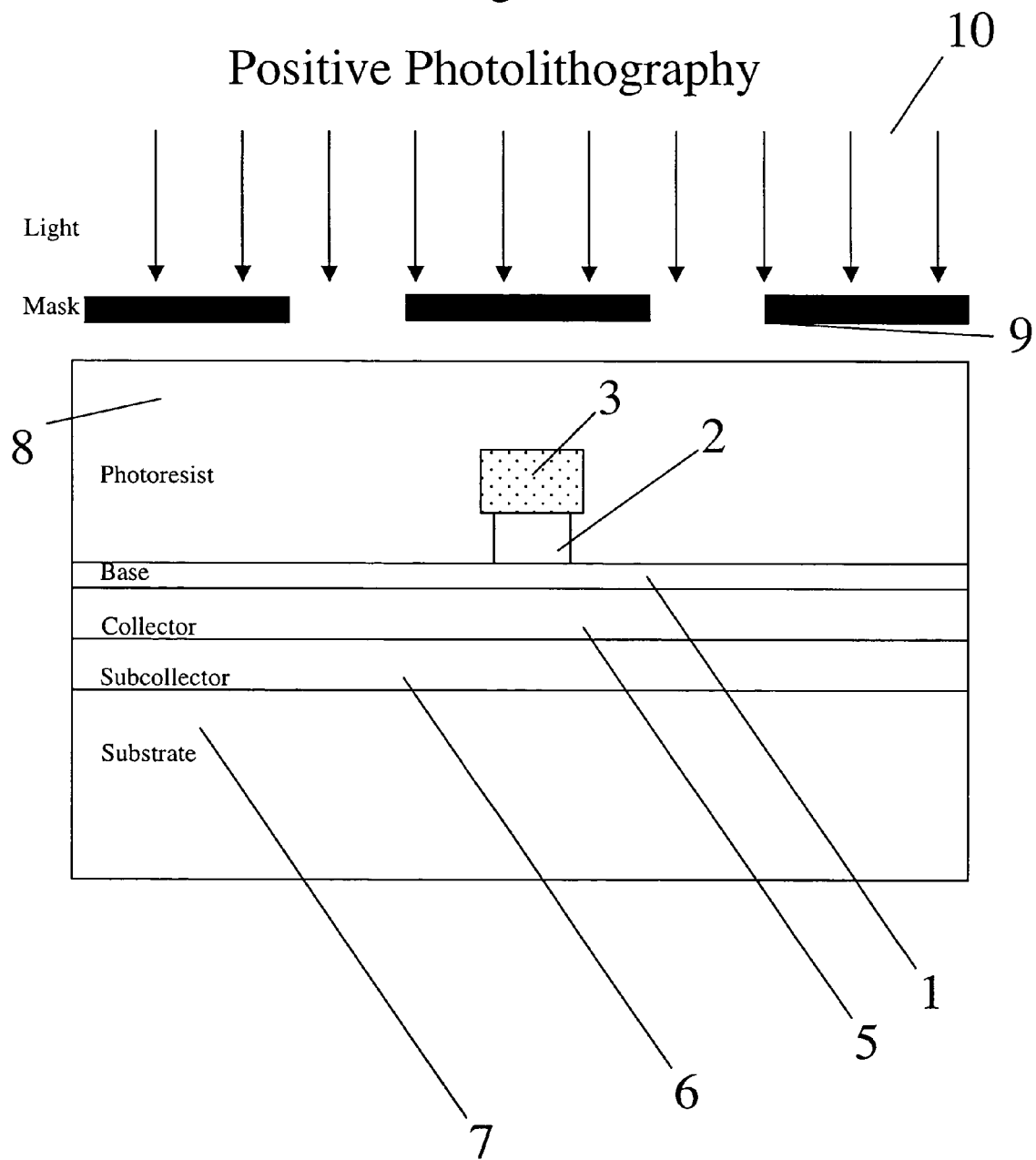
FIG. 13 depicts a cross-sectional view of the layer structure after applying photoresist layer and irradiating the photoresist layer through a mask, on a layer structure as shown in FIG. 7, designed for the process of positive photolithography according to the first embodiment of the present invention.

The other method, positive photolithography is shown FIG. 13. The photoresist layer 8 is irradiated by light 10 through a mask 9. The mask 9 covers the area of the emitter epitaxy 2 and the emitter metal 3 plus the later emitter-to base spacing $x_D$ on the left and right sight. After the irradiation, the surface of the photoresist layer 8, which was irradiated through the mask 9, becomes sensitive for removing. The area of the photoresist 8, which was covered and therefore not irradiated, stays insensitive and cannot be removed.

According to both methods the mask 9 is carefully designed so that after removing the non-irradiated photoresist 8 in the image reversal photography and after removing the irradiated photoresist 8 in the positive photolithography, parts of the base layer 1 are still covered by photoresist layer 8. Both methods, image reversal photolithography and positive photolithography yield a structure as shown in FIG. 14. The two methods use a positive or negative mask and require different photoresist material. Both methods, image reversal photolithography and positive photolithography are well known in the art. Both methods are described in Microlithography, Micromachining, and Microfabrication, Vol. 1: Microlithography, Editor P. Rai-Choudhury, 1997 SPIE Optical Engineering Press, Bellingham, Wash. and Semiconductor Lithography Principles, Practices, and Materials, Wayne M. Moreau, 1988 Plenum Press, New York, which are both incorporated herein by reference.

Figure 14:
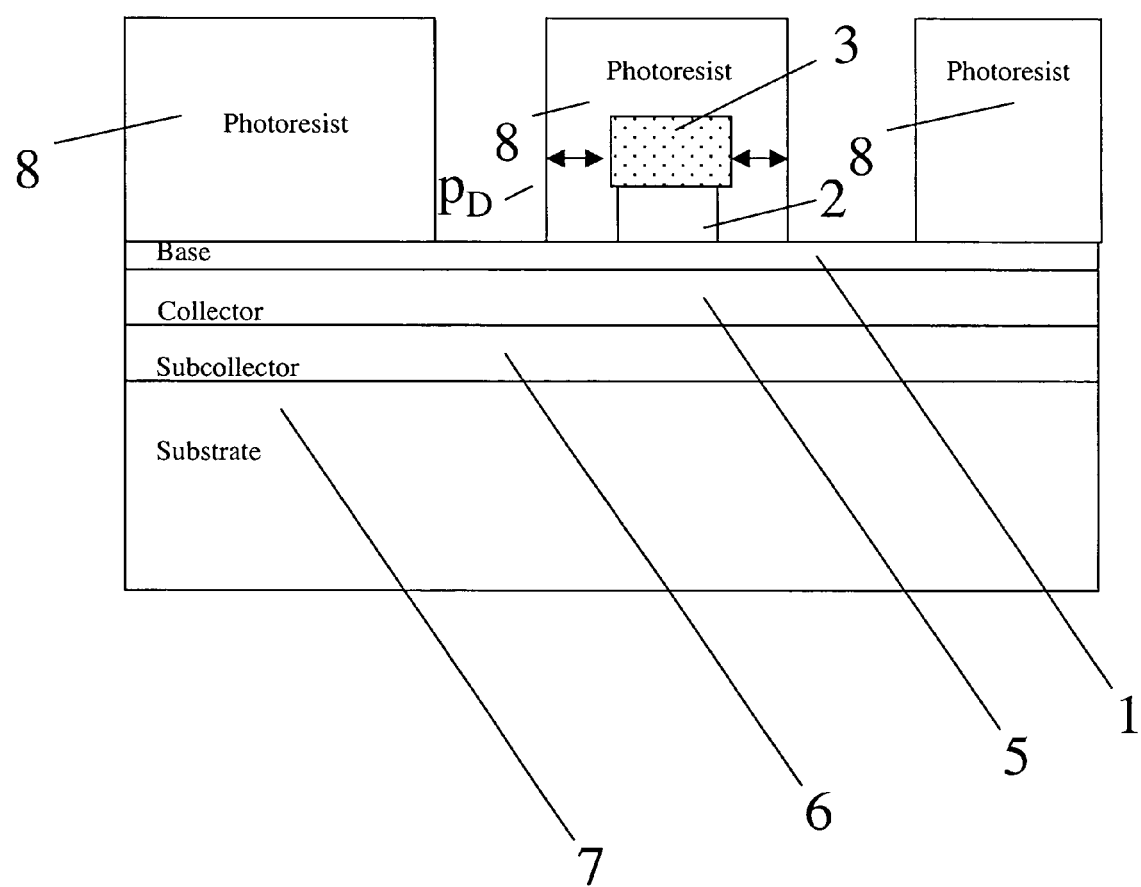
FIG. 14 depicts a cross-sectional view of the layer structure after removing non-irradiated photoresist layer in the process of image reversal photolithography as shown in FIG. 12 or after removing of irradiated photoresist layer in the process of positive photolithography as shown in FIG. 13.
Figure 15:
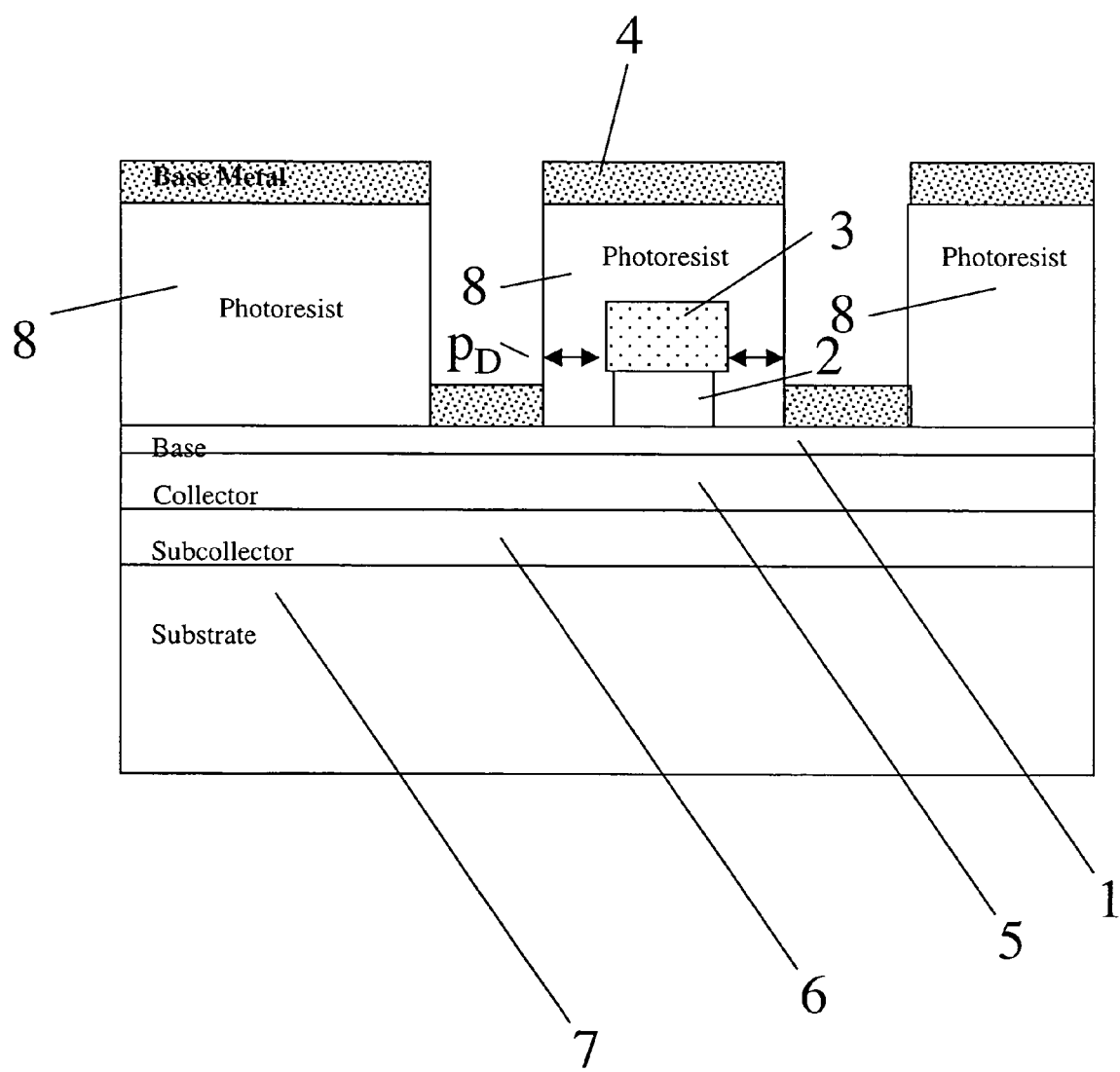
FIG. 15 depicts a cross-sectional view of the layer structure after base metal deposition on the wafer.

It is very important for the present invention that the emitter epitaxy 2 and the emitter metal 3 are not laid free and vertically and horizontally covered by the photoresist layer 8 as shown in FIG. 14. The width $p_D$ of the vertical coverage of the emitter metal 3 with photoresist 8 predetermines the later emitter-to-base spacing $x_d$. The thickness of the vertical coverage of the emitter metal 3 predetermines the emitter-to-base spacing $x_d$ as shown in FIG. 16. In the next step the entire top surface becomes covered by base metal 4 as shown in FIG. 15. In the next step the photoresist 8 is removed together with the base metal 4 on top of the photoresist 8 as shown in FIG. 16.

Figure 11:
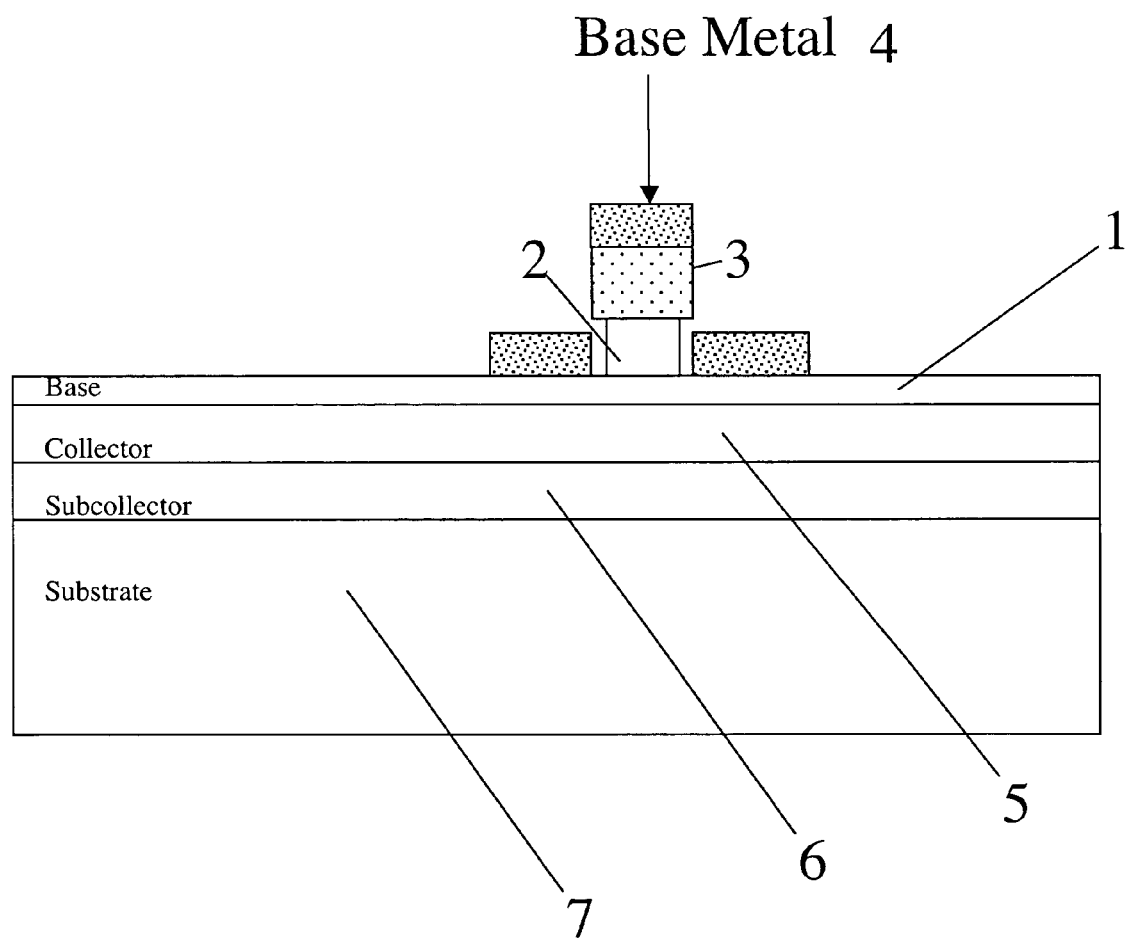
FIG. 11 depicts a cross-sectional view of the layer structure after removing photoresist layer and base metal layer on top of the photoresist layer according to the prior art.

A comparison between the SA design of the state of the art in FIG. 11 to the NSA design prepared by the method invention in FIG. 16 shows that an emitter-to-base spacing $x_d$ is created by the method according to the present invention. The pedestal comprising emitter epitaxy 2 below and in line with emitter metal 3 is not covered by the base metal 4 according to this embodiment of the invention.

Preparing of Self Aligned HBT by the Subtractive Method

Figure 17:
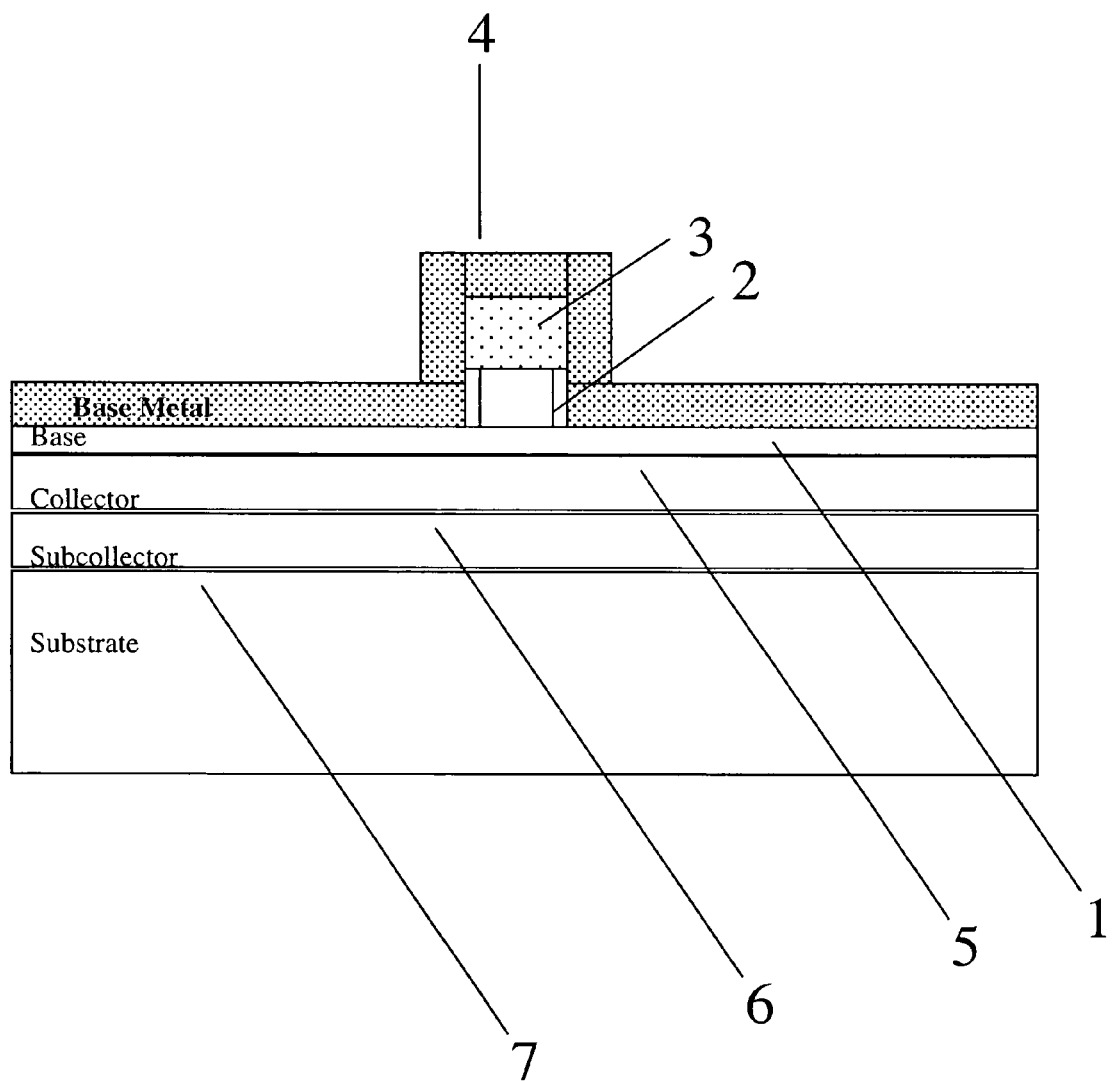
FIG. 17 depicts a cross-sectional view of the layer structure after applying base metal layer according to a second embodiment of the present invention on a layer structure as shown in FIG. 7.
Figure 18:
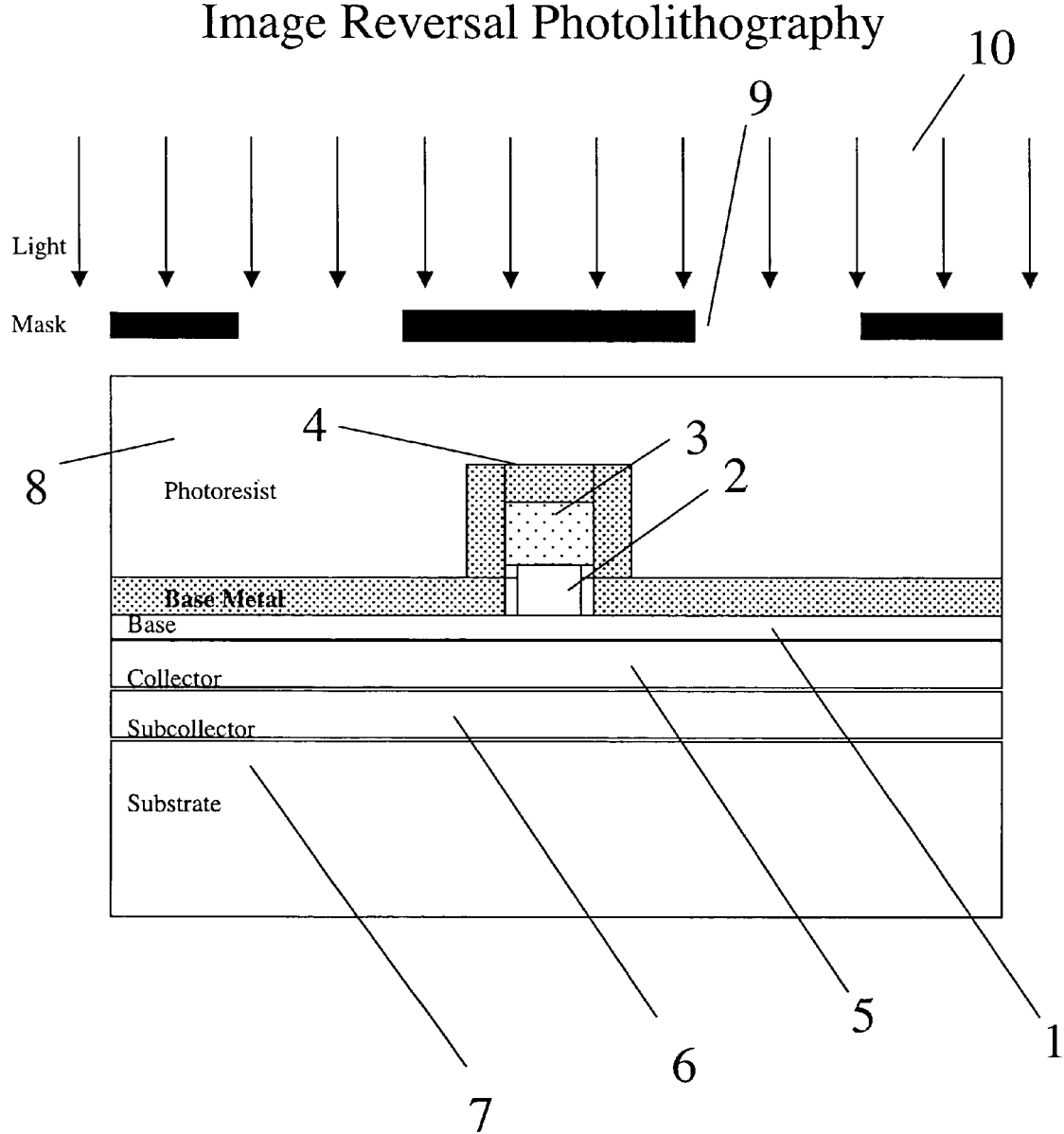
FIG. 18 depicts a cross-sectional view of the layer structure after applying a photoresist layer on the base metal layer and irradiating the photoresist layer through a mask designed for image reversal photolithography according to the second embodiment of the present invention.
Figure 19:
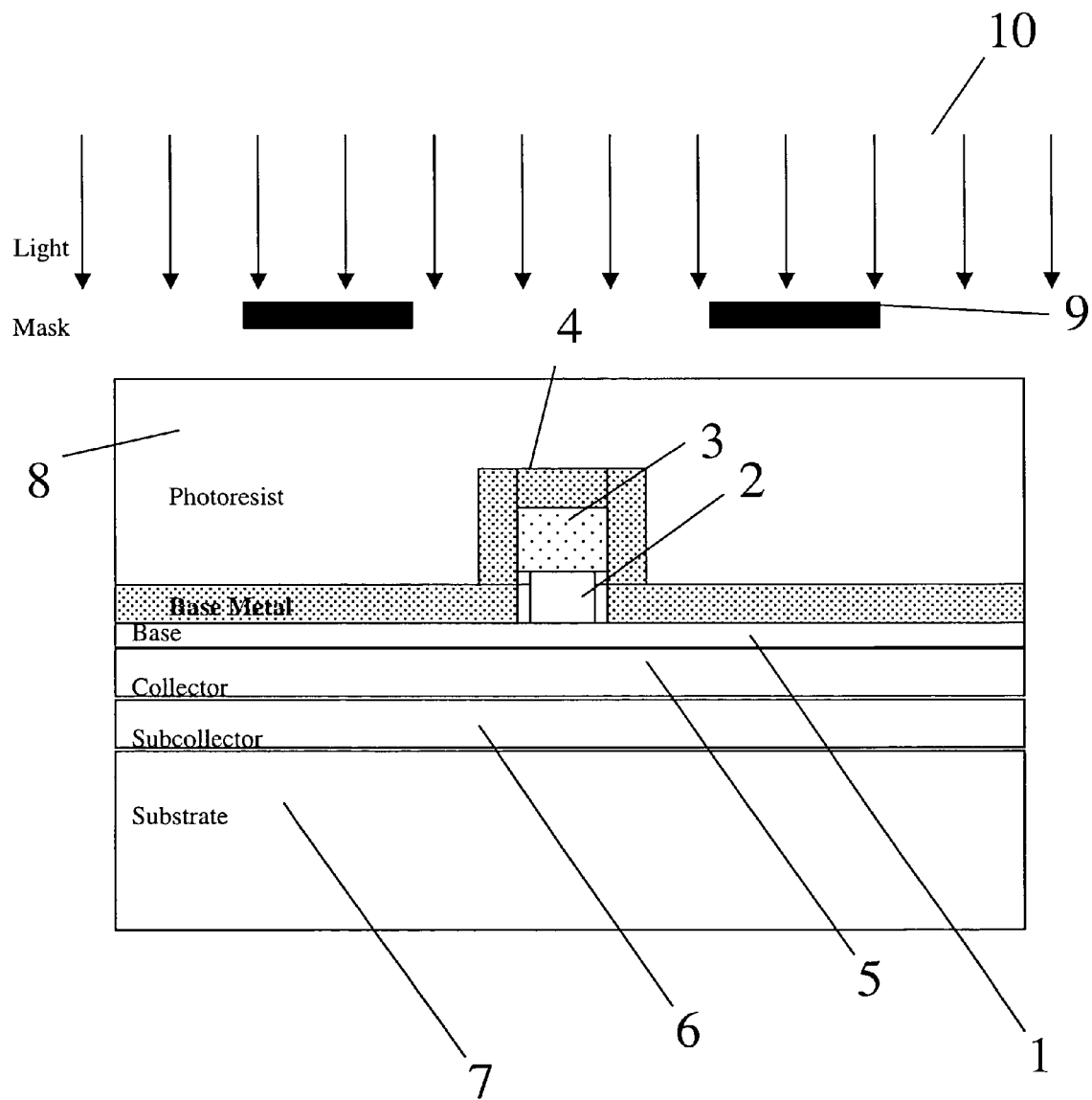
FIG. 19 depicts a cross-sectional view of the layer structure after applying a photoresist layer on the base metal layer and irradiating the photoresist layer through a mask designed for positive photolithography according to the second embodiment of the present invention.
Figure 20:
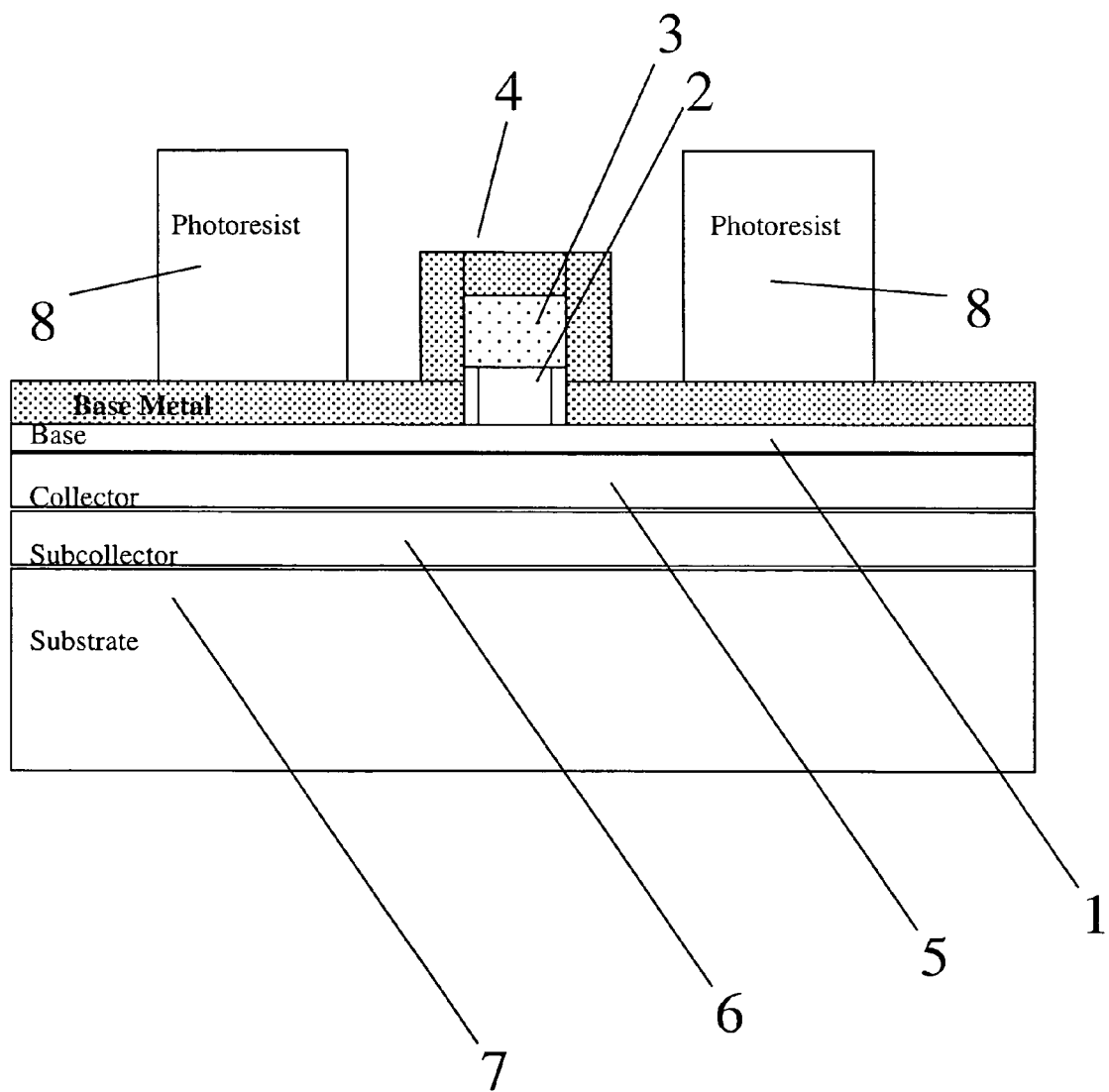
FIG. 20 depicts a cross-sectional view of the layer structure after removing photoresist layer in the desired areas.
Figure 21:
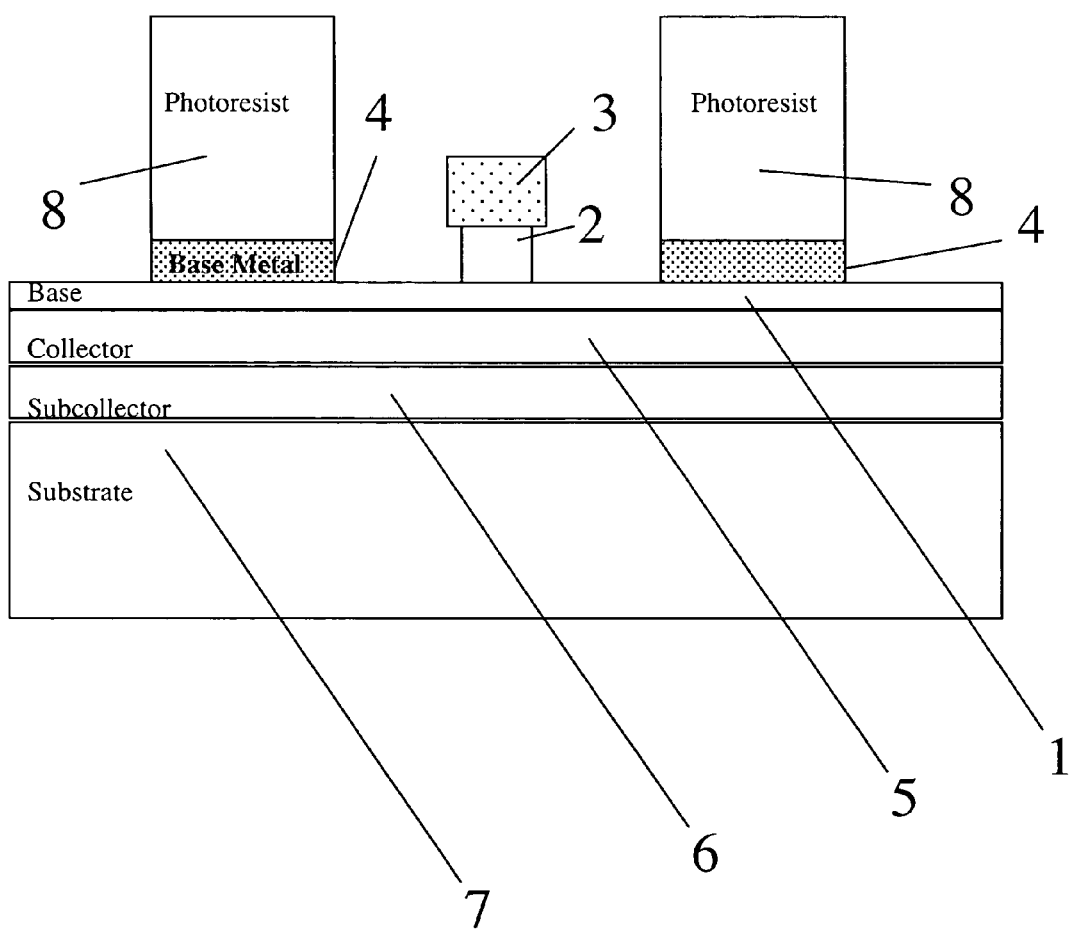
FIG. 21 depicts a cross-sectional view of the layer structure after removing base metal layer from the base layer, which is not covered by the photoresist layer.

The same starting layer structure as shown in FIG. 7 is used for the method according to this preferred embodiment, wherein a base metal 4 layer is applied on the top surface as shown in FIG. 17. Then a photoresist layer 8 is applied on the base metal 4 layer as shown in FIG. 18. Two different methods can be applied to irradiate and remove photoresist layer 8: the image reversal photography as shown in FIG. 18 and the positive photolithography as shown FIG. 19. Both methods are described in the preceding sections in regard to FIG. 12 and FIG. 13. According to both methods the mask 9 is carefully designed so that after removing the non-irradiated photoresist 8 in image reversal photolithography and after removing the irradiated photoresist 8 in the positive photolithography, parts of the base layer 1 are still covered by photoresist layer 8. The distance $p_D$ between the edge of the photoresist 8 covering the base metal 4 and emitter epitaxy 2 and the emitter metal 3 as shown in FIG. 20 predetermines the emitter-to-base spacing $x_d$ as shown in FIG. 22. In the next step the base metal layer 4, which is not covered by photoresist 8 is removed, wherein base metal 4 covered by photoresist 8 stays on the base 1 as shown in FIG. 21. In the next step the photoresist 8 is removed as shown in FIG. 22. The pedestal comprising emitter epitaxy 2 below and in line with emitter metal 3 is not covered by the base metal 4 according to this embodiment of the invention.

The Non-Self-Aligned Heterojunction Bipolar Transistor according to the present invention as shown in FIGS. 16 and 22, and 23 and 24 can be prepared by both methods of the present invention shown in FIGS. 12 to 16 and FIGS. 17 to 22.

The following preferred materials for metals and epitaxy are preferably used within the present invention. Any of the materials from each list can be used for each. That is, any metal on the list will work for any of the three contacts and any of the epi materials listed will work for any of the three epitaxy layers.

One or more of the following metals or metal alloys: InGaAs, InAlAs, InAs, InSb, AlInGaAs, InGaSb, GaAs, InP, InGaP, Si or SiGe can preferably be used as Emitter Epitaxy or Base Epitaxy or Collector Epitaxy.

One or more of the following metals or metal alloys: Titanium, Molybdenum, Aluminum, Gold, Platinum, Copper, Gold-Germanium, Nickel, Tantalum or Tungsten can preferably be used as Emitter Metal or Base Metal or Collector Metal.

One or more of the following metals or metal alloys: Silicon, SiGe, InP, GaAs, SiC, Quartz or Sapphire can preferably be used as Substrates.

Both light (photolithography) and even electron beam (e-beam) lithography are applicable to the invention here. With photolithography there is a standard chrome-on-quartz mask used, but any general mask works. The lithography could be either positive photolithography or image reversal photolithography. Both are applicable.

The following are examples for the process according to the present invention.

EXAMPLES

Example 1

Image Reversal Lithography Process

A photoresist layer of 1 μm was applied on the top surface of a layer structure (wafer) with emitter epitaxy and emitter metal as shown in FIG. 7. A photoresist SPR 955-1.1 of Shipley Company was applied as a liquid by spin-on processing to the wafer. The wafer was then heated on a hot plate by 90° C. for 60 seconds. The wafer was then exposed to a light through a mask as shown in FIG. 12. The light was i-line 365 nm. After the irradiation the wafer was baked in an image reversal oven using NH$_3$ gas at a temperature of 100° C. for 90 minutes. Then the entire wafer was exposed to a broadband illumination without a mask to complete the cross-linking process in the photoresist. Then the wafer was exposed to a photoresist developer MF 321 (Metal Ion Free) of Shipley Company. A wafer was obtained as shown in FIG. 14. Then base metal was deposited on the entire top surface of the wafer as shown in FIG. 15 using the process of thermal evaporation. A base metal was heated until the temperature of evaporation. First a thin layer of titanium as adhesion layer, then platinum as diffusion barrier and finally gold was deposited on the top surface of the wafer. Then the entire wafer was exposed to an acetone bath, wherein the photoresist was removed and a HBT precursor was obtained as shown in FIG. 16.

Example 2

Positive Lithography Process

A photoresist layer of 1 μm was applied on the top surface of a layer structure (wafer) with emitter epitaxy and emitter metal as shown in FIG. 7. A photoresist SPR 955-1.1 of Shipley Company was applied as a liquid by spin-on processing to the wafer. The wafer was then heated on a hot plate by 100° C. for 60 seconds. The wafer was then exposed to a light through a mask as shown in FIG. 13. The light was i-line 365 nm. Then the wafer was exposed to a photoresist developer MF 26A (Metal Ion Free) of Shipley Company. A wafer was obtained as shown in FIG. 14. Then base metal was deposited on the entire top surface of the wafer as shown in FIG. 15 using the process of thermal evaporation. A base metal was heated until the temperature of evaporation. First a thin layer of titanium as adhesion layer, then platinum as diffusion barrier and finally gold was deposited on the top surface of the wafer. Then the entire wafer was exposed to an acetone bath, wherein the photoresist was removed and a HBT precursor was obtained as shown in FIG. 16.

Although the description above contains much specificity, this should not be construed as limiting the scope of the invention but as merely providing illustrations of some of the presently preferred embodiments of this invention. For example the process described above can involve additional or fewer steps and different priorities of steps.

Thus the scope of the invention should be determined by the appended claims and their legal equivalents, rather than by the examples given.

What I claim is:

1. A method for preparing a heterojunction bipolar transistor comprising:
    a) preparing a patterned emitter metal on an emitter layer of a HBT structure on a substrate;
    b) preparing an emitter epitaxy below the emitter metal;
    c) depositing a base metal layer on the top surface of the HBT structure;
    d) applying a resist layer on the base metal layer;
    e) applying photolithography covering the peripheral edge of the emitter epitaxy and the emitter metal with a width $p_D$ and leaving a pattern according to a mask in the resist;
    f) removing base metal not covered by resist; and
    g) removing the remaining resist and defining a base metal, the base metal being spaced from the emitter epitaxy and the emitter metal by a distance $x_D$.

2. The method according to claim 1, wherein the emitter epitaxy and the emitter metal is prepared by etching off the emitter metal layer and the emitter epi layer.

3. The method according to claim 1, wherein the photolithography is image reversal photolithography or positive photolithography.

4. The method according to claim 1, wherein the photolithography is a light photolithography or electron beam lithography.

5. The method according to claim 1, wherein the photolithography is carried out with a chrome-on-quartz mask.

6. The method according to claim 1, wherein a subcollector layer is applied on a substrate and a collector layer is applied on the subcollector layer and the base metal layer is applied on the subcollector layer.

7. The method according to claim 1, wherein one or more of the following metals or metal alloys are used to prepare emitter epitaxy, base epitaxy or collector epitaxy: InGaAs, InAlAs, InAs, InSb, AlInGaAs, InGaSb, GaAs, InP, InGaP, Si or SiGe.

8. The method according to claim 1, wherein one or more of the following metals or metal alloys are used to prepare emitter metal, base metal or collector metal: Titanium, Molybdenum, Aluminum, Gold, Platinum, Copper, Gold, Germanium, Nickel, Tantalum or Tungsten.

9. The method according to claim 1, wherein one or more of the following metals or metal alloys are used to prepare substrates: Silicon, SiGe, InP, GaAs, SiC, Quartz or Sapphire.

10. The method according to claim 1, wherein the emitter layer is an emitter epi layer.

11. The method according to claim 1, wherein the HBT structure is a HBT epi structure.

12. The method according to claim 1, wherein the epi layer structure comprises subcollector, collector, base and epi layer.

13. The method according to claim 1, wherein the heterojunction bipolar transistor is non-self-aligned.

* * * * *